United States Patent [19]

Tamayama

[11] Patent Number: 5,572,155
[45] Date of Patent: Nov. 5, 1996

[54] CCD SIGNAL READ-OUT CIRCUIT FREE FROM ALIASING OF HIGH-FREQUENCY NOISES

[75] Inventor: Hiroshi Tamayama, Asaka, Japan

[73] Assignee: Fuji Photo Film Co., Ltd., Kanagawa, Japan

[21] Appl. No.: 474,670

[22] Filed: Jun. 7, 1995

[30] Foreign Application Priority Data

Jun. 20, 1994 [JP] Japan .................................. 6-137296
May 23, 1995 [JP] Japan .................................. 7-123482

[51] Int. Cl.$^6$ .............................. G11C 27/02; H04N 5/14
[52] U.S. Cl. ........................... 327/94; 348/242; 348/250
[58] Field of Search ................................. 327/91, 94, 96; 348/241, 242, 250, 266, 320, 321, 322, 323

[56] References Cited

U.S. PATENT DOCUMENTS

| | | | |
|---|---|---|---|
| 4,238,765 | 12/1980 | Nagumo | 358/43 |
| 4,287,441 | 9/1981 | Smith | 327/94 |
| 4,605,969 | 8/1986 | Green | 358/213 |
| 4,774,565 | 9/1988 | Freeman | 358/41 |
| 4,992,876 | 3/1991 | Nishizawa et al. | 358/213.1 S |
| 5,010,408 | 4/1991 | Toohey | 358/213.11 |
| 5,029,189 | 7/1991 | Sato et al. | 327/91 |
| 5,034,633 | 7/1991 | Stekelenburg | 327/91 |
| 5,177,599 | 1/1993 | Takagi et al. | 358/29 |
| 5,276,508 | 1/1994 | Boisvert et al. | 358/48 |
| 5,299,032 | 3/1994 | Kurita | 348/250 |
| 5,309,183 | 5/1994 | Sasaki et al. | 348/233 |
| 5,323,233 | 6/1994 | Yamagami et al. | 348/277 |
| 5,329,312 | 7/1994 | Boisvert et al. | 348/256 |
| 5,392,070 | 2/1995 | Endo et al. | 348/247 |
| 5,396,441 | 3/1995 | Ozawa | 348/242 |
| 5,436,656 | 7/1995 | Soga et al. | 348/220 |
| 5,471,515 | 11/1995 | Fossum et al. | 377/60 |

FOREIGN PATENT DOCUMENTS

| | | |
|---|---|---|
| 336138 | 7/1991 | Japan . |
| 3229580 | 10/1991 | Japan . |
| 466880 | 6/1992 | Japan . |

Primary Examiner—Timothy P. Callahan
Assistant Examiner—My-Trang Nu Ton
Attorney, Agent, or Firm—Sughrue, Mion, Zinn, Macpeak & Seas

[57] ABSTRACT

A CCD signal read-out circuit is operative, upon receipt of a CCD signal outputted from a CCD, to output an output signal from which a reset noise has been removed through correlated double sampling. The CCD signal includes pixel periods each comprising a reset period, a succeeding feed-through period and a further succeeding pixel signal period. The read-out circuit comprises: first and second signal extractors for receiving the CCD signal and extracting a feed-through signal and a pixel signal for the respective pixel periods, respectively; first and second low-pass filters for low-pass filtering the feed-through signal and the pixel signal extracted by the first and second signal extractors, respectively; a signal hold circuit for sampling and holding the feed-through signal filtered by the first low-pass filter; and a differential amplifier for subtracting the pixel signal filtered by the second low-pass filter from a signal sampled and held by a signal hold circuit and outputting the resultant output signal.

21 Claims, 17 Drawing Sheets

→ TIME

→ TIME

CCD SIGNAL READ-OUT CIRCUIT FREE FROM ALIASING OF HIGH-FREQUENCY NOISES

BACKGROUND OF THE INVENTION

1. Field of the Invention

The present invention relates to a CCD (charge-coupled device) signal read-out circuit, and more particularly to a circuit for reading signals of a CCD used in the form of a solid state image sensor.

2. Description of the Background Art

In a CCD solid state image sensor, electric charges corresponding to signals representative of a line or field of pixels are stored in photo-diodes which are arranged in a linear array or in a matrix configuration pixels thus stored are sequentially transferred to a floating capacitor in a horizontal scanning fashion. The floating capacitor holds the electric charges transferred from the photo-diodes after having cleared the previous charges by applying a reset pulse to the pixels. Those electric charges are developed via a floating diffusion amplifier (FDA) in the form of a CCD signal or a video signal. This signal contains a reset noise (kTC) caused by the floating diffusion amplifier and a fluctuation noise (1/f noise) generated from semiconductor devices included in the floating diffusion amplifier. The noises may be removed by a correlated double sampling circuit (CDS circuit) or a clamp circuit. For the correlated double sampling circuit, there are known, for example, CDS circuits described in Japanese Patent Laid Open Gazette No. 229580/1991, Japanese Utility Model Publication No. 36138/1991 and and Japanese Utility Model Laid Open Gazette No. 66880/1992.

In the correlated double sampling circuit, signal levels during a feed-through period following a reset period in a pixel period are clamped with a clamp pulse, signals during the subsequent pixel signal period are sampled with a sampling pulse. As another correlated doubled sampling circuit, there is one arranged in such a manner that a feed-through period and subsequent signal period are sampled and held, and the resultant outputs are applied to a differential amplifier to cancel the reset noise components. These conventional circuits are described in Japanese Patent Laid Open Publication No. 2295801/1991, for example. Clamping and sampling the signals in this manner brings about mismatch of the signals, which basically contain high frequency noises, with a Nyquist frequency of sampling. As a result, noises lying in a frequency band higher than a frequency equal to one half of the sampling frequency are folded or turned back to the signals. Limitation of the frequency band to a lower band before the correlated double sampling may reduce aliasing noises. However, this involves a distortion of the signal waves and a deterioration of the noise suppression effect by the correlated double sampling. Thus, this causes interference to signals of the adjacent pixels, deterioration of the resolution of the image and color mixture to the adjacent pixels.

Output signals from the solid state image sensor contain also high-frequency noises which are generated from the floating diffusion amplifier and not correlated. However, the high-frequency noises cannot be removed by the correlated double sampling circuit. On the contrary, those noises are folded into the signals owing to the clamping and sample and hold operations of the correlated double sampling circuit. This causes deterioration of an S/N ratio in the system. Hitherto, in order to remove the high-frequency noises, there is adopted an integrator type of sample and hold circuit as disclosed in Japanese Utility Model Publication Nos. 36138/1991 and 66880/1991 referenced above. However, the conventional circuit is complicated in structure and in addition the system needs a higher rate of pulses.

SUMMARY OF THE INVENTION

It is therefore an object of the present invention to provide a CCD signal read-out circuit capable of obtaining images improved in S/N ratio, reducing aliasing noises.

It is another object of the present invention to provide a CCD signal read-out circuit capable of reducing the aliasing of high-frequency noises and also compatible with high-rate signal reading without a sophisticated circuit arrangement.

In order to solve the problems mentioned above, there is provided a CCD signal read-out circuit for receiving a first signal outputted from a charge-coupled device (CCD), and substantially removing a reset noise from the first signal through a correlated double sampling to produce a second signal free from the reset noise. The first signal includes a plurality of pixel periods each comprising a reset period, a succeeding feed-through period and a further succeeding pixel signal period. The CCD signal read-out circuit comprises: first and second signal extractor circuits for receiving the first signal and extracting a feed-through signal and a pixel signal for each of the plurality of pixel periods, respectively; first and second low-pass filter circuits for low-pass filtering the feed-through signal and the pixel signal extracted by the first and second signal extractor circuits, respectively; a signal hold circuit for sampling and holding the feed-through signal filtered by the first low-pass filter circuit; and a differential amplifier for subtracting the pixel signal filtered by the second low-pass filter circuit from a signal sampled and held by the signal hold circuit and outputting the second signal.

Further, according to the present invention, the CCD signal read-out circuit comprises: first and second signal extractor circuits for receiving the first signal and extracting a feed-through signal and a pixel signal for each of the plurality of pixel periods, respectively; first and second low-pass filter circuits for low-pass filtering the feed-through signal and the pixel signal extracted by the first and second signal extractor circuits, respectively; a delay circuit for delaying the feed-through signal filtered by the first low-pass filter circuit until the succeeding pixel signal period comes; and a differential amplifier for subtracting the pixel signal filtered by the second low-pass filter circuit from a signal delayed by the delay circuit and outputting the second signal.

Furthermore, according to the present invention, the first CCD signal read-out circuit comprises: a delay circuit for delaying the first signal until the succeeding pixel signal period comes; first signal extractor circuit for receiving a signal thus delayed by the delay circuit and extracting a feed-through signal for each of the plurality of pixel periods; second signal extractor circuit for receiving the first signal and extracting a pixel signal for each of the plurality of pixel periods; first and second low-pass filter circuits for low-pass filtering the feed-through signal and the pixel signal extracted by the first and second signal extractor circuits, respectively; and a differential amplifier for subtracting the pixel signal filtered by the second low-pass filter circuit from the feed-through signal filtered by the first low-pass filter circuit and outputting the second signal.

Still further, according to the present invention, the CCD signal read-out circuit comprises: first and second signal extractor circuits for receiving the first signal and extracting a feed-through signal and a pixel signal for each of the plurality of pixel periods, respectively; first and second averaging circuits for averaging and shifting phases of the feed-through signal and the pixel signal extracted by said first and second signal extractor circuits, respectively, to bring both of the signals in phase; a differential amplifier for producing a difference between signals outputted from said first and second averaging circuits and outputting a resultant signal as the second signal.

In order to solve the problems as mentioned above, there is also provided a CCD signal read-out circuit for receiving a first signal outputted from a CCD and including a plurality of pixel periods each comprising a feed-through period and a signal period, and substantially reducing a correlated noise and a high-frequency noise included in the signal period to produce a second signal free from the correlated noise and high-frequency noise. The CCD signal read-out circuit comprises: first and second signal extractor circuits for receiving the first signal and extracting levels of the feed-through period and the signal period for each of the plurality of pixel periods to develop a feed-through signal and a pixel signal, respectively; a signal inverter circuit for inverting either one of the feed-through signal and the pixel signal extracted by the first and second signal extractor circuits and outputting a resultant signal in the form of a serial signal: and an averaging circuit for averaging the serial signal to output a signal in which the correlated noise and the high-frequency noise have substantially been reduced.

Further, according to the present invent ion, the CCD signal read-out circuit comprises: first and second signal extractor circuits for receiving the first signal and extracting levels of the feed-through period and the signal period for each of the plurality of pixel periods to develop a feed-through signal and a pixel signal, respectively; a signal inverter circuit for inverting either one of the feed-through signal and the pixel signal extracted by the first and second signal extractor circuits and outputting a resultant signal in the form of a serial signal; a selector circuit for selecting the serial signal for first one of the plurality of pixel periods to develop a first serial signal, and selecting the serial signal for second one, different from the first pixel period, of the plurality of pixel periods to develop a second serial signal; a first averaging circuit for averaging the first serial signal to output a signal in which the correlated noise and the high-frequency noise have substantially been reduced; and a second averaging circuit for averaging the second serial signal to output a signal in which the correlated noise and the high-frequency noise have substantially been reduced.

Furthermore, according to the present invention, the CCD signal read-out circuit comprises: a first signal extractor circuit for receiving the first signal and extracting levels of the feed-through period and the signal period during first one of the plurality of pixel periods to develop a first feed-through signal and a first pixel signal, respectively; a second signal extractor circuit for receiving the first signal and extracting levels of the feed-through period and the signal period during second one, different from the first pixel period, of the plurality of pixel periods to develop a second feed-through signal and a second pixel signal, respectively; a first signal inverter circuit for inverting either one of the first feed-through signal and the first pixel signal and outputting a resultant signal as a first serial signal; a second signal inverter circuit for inverting either one of the second feed-through signal and the second pixel signal and outputting a resultant signal as a second serial signal; a first averaging circuit for averaging the first serial signal to output a signal in which the correlated noise and the high-frequency noise have substantially been reduced; and a second averaging circuit for averaging the second serial signal to output a signal in which the correlated noise and the high-frequency noise have substantially been reduced.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
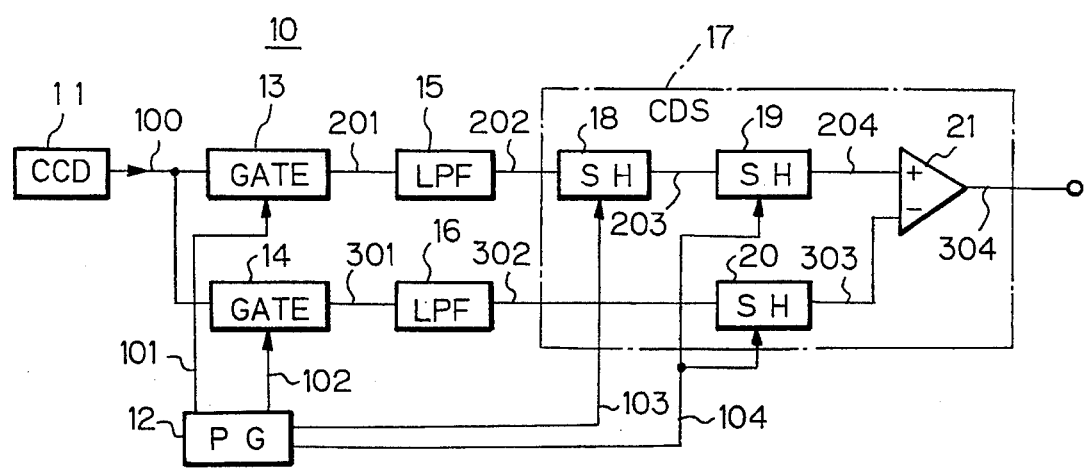
FIG. 1 is a schematic block diagram showing an embodiment of a CCD signal read-out circuit according to of the present invention.
Figure 2:
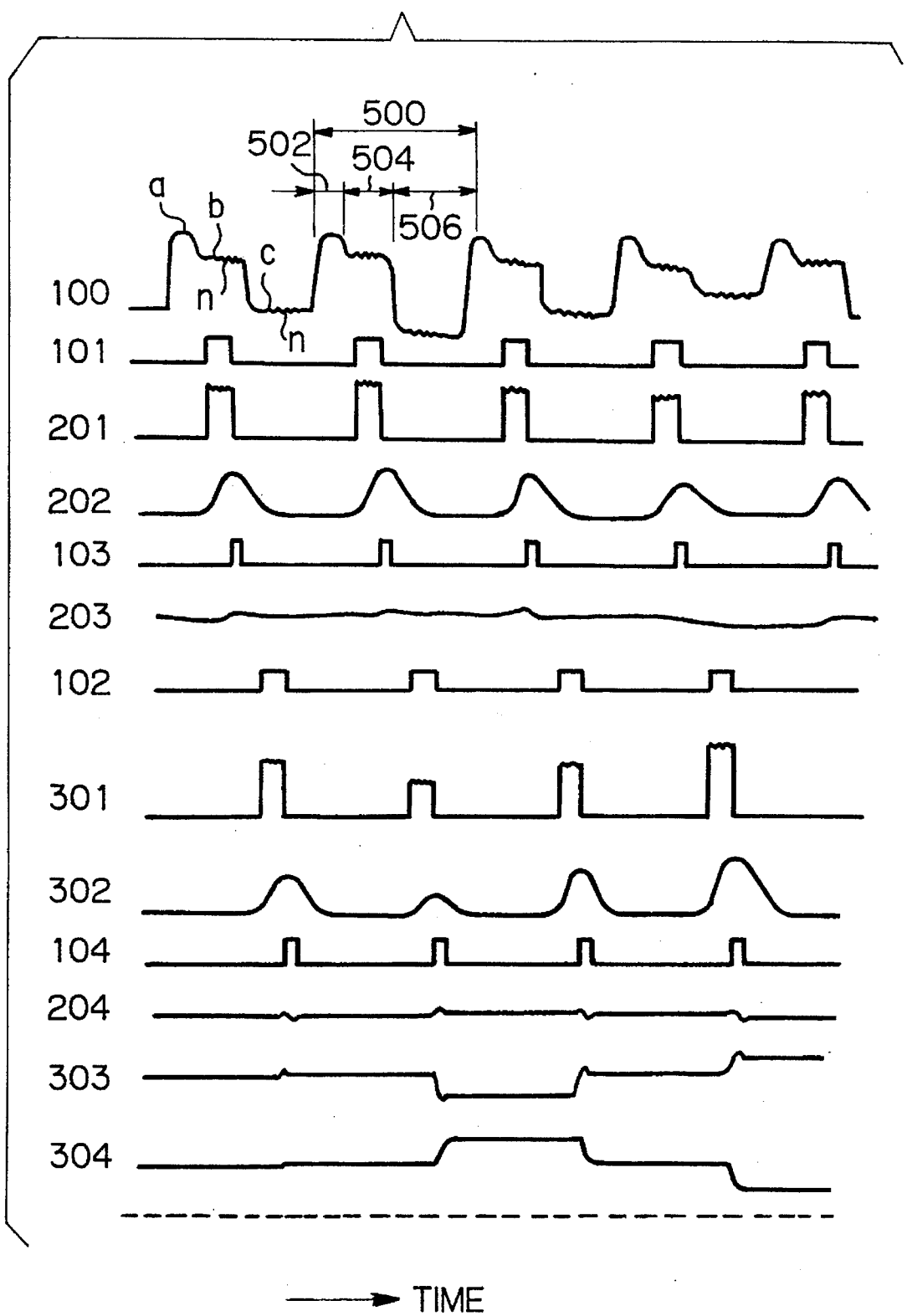
FIG. 2 is a time chart useful for understanding the operation of the CCD signal read-out circuit shown in FIG. 1.

FIG. 1 shows an embodiment of the CCD signal read-out circuit 10 according to the present invention. As a solid state image sensor, the CCD signal read-out circuit 10 includes a charge-coupled device (CCD) 11, which is arranged with a bi-dimensional photosensitive diode array and is applicable to a solid state image sensing camera, for example. In the instant embodiment, the solid state image sensor 11 outputs pixel signals 100 in time with a clock frequency of 7.16 MHz. Hereinafter signals will be designated by reference numerals or letters designating connecting lines on which the signals appear. As seen from FIG. 2, according to the present embodiment, the pixel signal 100 has repetitive pixel periods 500 of 140 nanoseconds (ns). Each of the pixel periods 500 comprises a reset period 502, a succeeding feed-through period 504 and a further succeeding pixel signal period 506. A feed-through signal $\underline{b}$ succeeding a reset component $\underline{a}$ and a succeeding pixel signal $\underline{c}$ contain a high-frequency noise $\underline{n}$ having the frequency band in the order of 50 MHz.

The pixel signal 100 is fed to two gates 13 and 14 which serve as signal extracting circuits responsive to gate pulses 101 and 102 generated from a pulse generator circuit (PG) 12 for extracting a feed-through signal 201 and a pixel signal 301 from the signal 100, respectively. The pulse generator circuit (PG) 12 serves as a timing signal generator for generating various timing pulses to operate the associated subsections of the system. For example, the gate pulses 101 and 102 have a duration of 20 ns in conformity with the signal $\underline{b}$ on the feed-through period 504 and the signal $\underline{c}$ on the pixel signal period 506, respectively.

The gates 13 and 14 have outputs 201 and 301 connected to low-pass filters (LPF) 15 and 16, respectively. The low-pass filters 15 and 16 have the cut-off frequency of 14 MHz, for example, and are adapted to output signals 202 and 302 having high-frequency noises eliminated from the feed-through signal 201 and the pixel signal 301, respectively. The low-pass filters 15 and 16 have outputs 202 and 302 connected to a correlated double sampling (CDS) circuit 17.

The correlated double sampling circuit 17 serves to cancel reset noises and 1/f noises from the signals developed from the charge-coupled device 11, which are contained in the correlated feed-through signal $\underline{b}$ and pixel signal $\underline{c}$, to output an image signal 304 in which these noises are minimized. The correlated double sampling circuit 17 comprises three sample and hold circuits (SH) 18, 19 and 20. One sample and hold circuit 18 is connected to the low-pass filter 15 and the pulse generator circuit 12, and is arranged to extract the peak value of the signal 202 in response to a sampling pulse or clamp pulse 103 from the pulse generator circuit 12 and hold the value thus extracted to produce signal 203. Another sample and hold circuit 20 is connected to the low-pass filter 16 and the pulse generator circuit 12, and is also arranged to extract the peak value of the signal 302 in response to a sampling pulse 104 from the pulse generator circuit 12 and hold the value thus extracted to produce signal 303. The remaining sample and hold circuit 19 is connected to the sample and hold circuit 18, and is arranged to sample the signal 203 in response to the sampling pulse 104 from the pulse generator circuit 12 and hold the corresponding signal 204. The sample and hold circuits 19 and 20 have outputs 204 and 303 connected to a differential amplifier 21. The differential amplifier 21 serves as an operating circuit for subtracting the signal 303 from the signal 204 to develop an image signal 304.

In operation, the charge-coupled device 11 outputs the pixel signal 100 in time with a clock frequency of 7.16 MHz. The pixel signal 100 is in turn fed to the gates 13 and 14. Upon receipt of the pixel signal 100, the gates 13 and 14 extract the feed-through signal 201 and the pixel signal 301 from the signal 100 in response to the gate pulses 101 and 102, generated from the pulse generator circuit 12 respectively. The feed-through signal 201 thus extracted is fed to the low-pass filter 15, which in turn eliminates high-frequency noises exceeding its the filter's cut-off frequency. The thus obtained signal is fed in the form of signal 202 to the sample and hold circuit 18. The sample and hold circuit 18 extracts the peak value of the signal 202 in response to the sampling pulse and holds the extracted value in the form of the signal 203. The signal 203 thus held is fed to the sample and hold circuit 19 and is subjected to a sampling process to be held in the form of the associated signal 204.

According to the present embodiment, the CCD signal read-out circuit is so arranged that the entered pixel signal is subjected to low-pass filtering to have high-frequency noises eliminated, and then to a sample and hold process by the correlated double sampling circuit 17. Therefore, this arrangement involves less degradation of the S/N ratio which would otherwise be caused by aliasing of the high-frequency noises. Further, according to the present embodiment, the feed-through signal and the pixel signal are separated by the gate circuits 13 and 14 and then are subjected to the low-pass filtering. This involves no degradation to the noise suppression of the correlated double sampling circuit 17 which would otherwise be caused by the distortion of the waveform, thereby suppressing the reset noise and the 1/f noise of the CCD signal. It is thus possible to reproduce images improved in S/N ratio.

On the other path, the pixel signal 301 extracted by the gate 14 is fed to the other low-pass filter 16 to have the high frequency noises higher than the filter's cut-off frequency eliminated. Signal 302 from the low-pass filter 16 is fed to the sample and hold circuit 20, which in turn holds signal 303 corresponding to the peak value of the signal 302. The signals 204 and 303 thus held by the sample and hold circuits 19 and 20, respectively, are fed to the differential amplifier 21, which subtracts the signal 303 from the 204 to output the image signal 304. In this manner, in the image signal 304, the reset noise and the 1/f noise which are caused by the charge-coupled device 11 and contained in the correlated feed-through signal $\underline{b}$ and pixel signal $\underline{c}$ are cancelled. Specifically, the sampling or clock noise, which will be generated throughout the sample hold process, can be cancelled through the subtraction by the differential amplifier 21.

Figure 3:
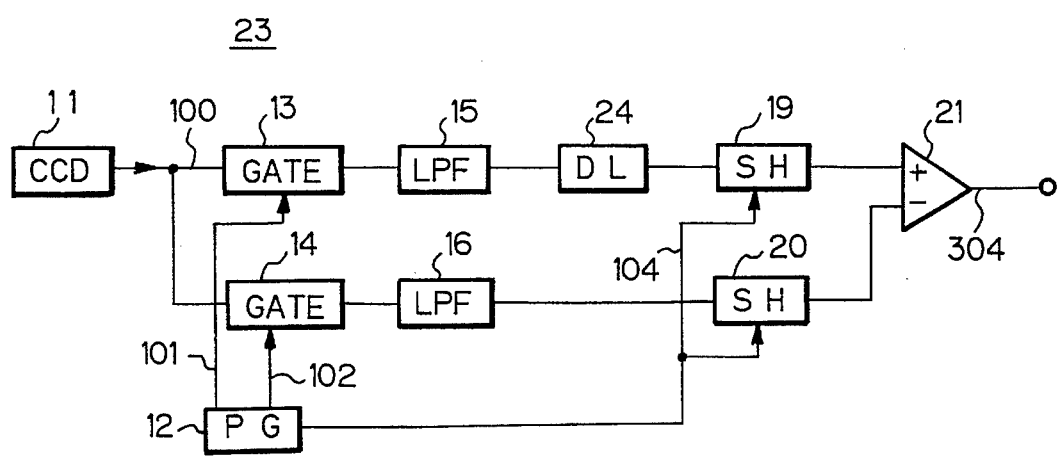
FIG. 3 is a schematic block diagram, similar to FIG. 1, showing an alternative embodiment of the CCD signal read-out circuit according to the present invention.
Figure 4:
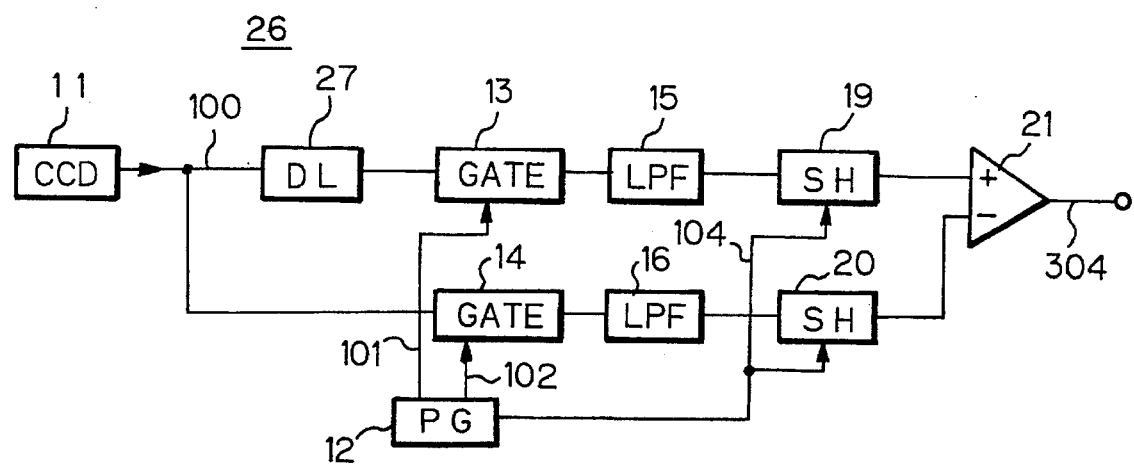
FIG. 4 is a block diagram, similar to FIG. 1, showing another alternative embodiment of the CCD signal read-out circuit according to the present invention.
Figure 5:
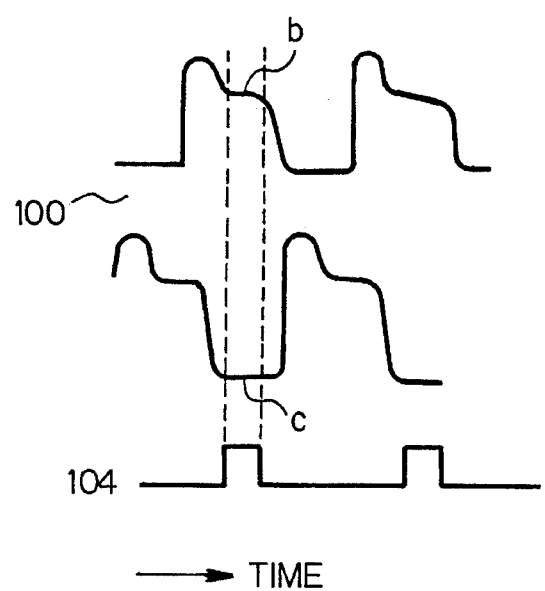
FIG. 5 shows an example of the waveforms appearing in the CCD signal read-out circuits shown in FIGS. 3 and 4.

FIG. 3 is a schematic block diagram of an alternative embodiment of the CCD signal read-out circuit according to the present invention. The CCD signal read-out circuit 23 shown in FIG. 3 is identical to the CCD signal read-out circuit 10 shown in FIG. 1 except for the sample and hold circuit 18 in FIG. 1 replaced by a delay (DL) circuit 24. In the following figures, the like elements will be denoted by the same reference numerals as those of FIGS. 1 and 3, and redundant description will be omitted. FIG. 4 is a schematic block diagram of another alternative embodiment of the CCD signal read-out circuit according to the present invention. The CCD signal read-out circuit 26 shown in the figure is different from what is shown in FIG. 3 in that a delay circuit 27 which may correspond to the delay circuit 24 in the read-out circuit 23 shown in FIG. 3 is provided between the output 100 of the charge-coupled device 11 and the gate 13. In both of the embodiments, as seen from FIG. 5, the delay circuits 24 and 27 are arranged to delay the feed-through signal $\underline{b}$ of the CCD signal 100 so as to have the same transmitted together with the pixel signal $\underline{c}$ in phase to the differential amplifier 21, thereby cancelling the correlated noise.

According to these embodiments, the CCD signal read-out circuit is so arranged that the entered pixel signal is subjected to a low-pass filtering to eliminate high-frequency noises, and then to the sample and hold process by the sampling circuits 19 and 20. This arrangement may therefore involve less degradation of the S/N ratio that would otherwise be produced due to aliasing of the high-frequency noises. Further, according to these embodiments, the feed-through signal and the pixel signal are separated by the gate circuits 13 and 14 and then subjected to the low-pass filtering. This involves no degradation of the noise suppression effect of the correlated double sampling circuit 17 which would otherwise be caused by the distortion of the waveforms, thereby suppressing the reset noise and the 1/f noise of the CCD signal. It is thus possible to obtain images excellent in S/N ratio.

Figure 6:
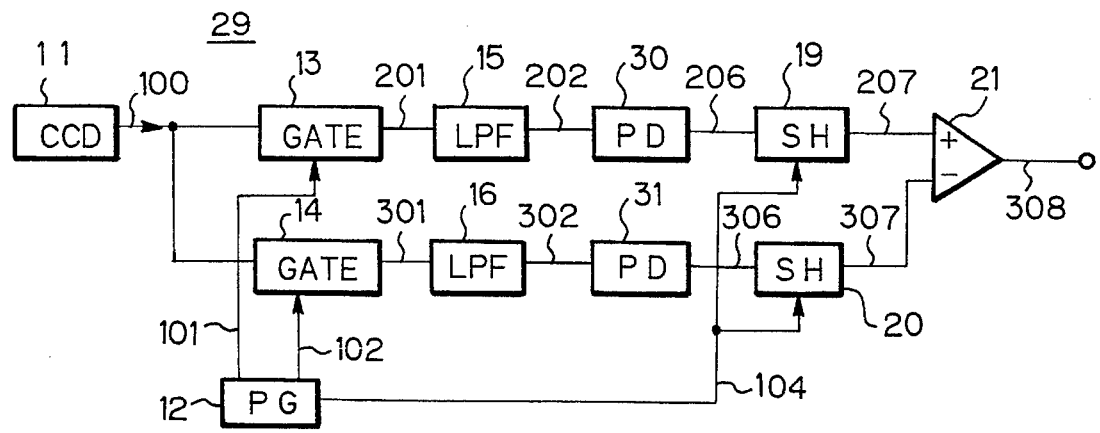
FIG. 6 is a schematic block diagram, similar to FIG. 1, of a further alternative embodiment of the CCD signal read-out circuit according to the present invention.

FIG. 6 is a schematic block diagram of a further alternative embodiment of the CCD signal read-out circuit according to the present invention. The CCD signal read-out circuit 29 shown in FIG. 6 is different from the read-out circuit 10 shown in FIG. 1 in that instead of the sample and hold circuit 18 the circuit 10, there is provided an arrangement such that a peak detector circuit (PD) 30 is provided on the output 202 of the low-pass filter 15 and another peak detector circuit 31 is provided on the output 302 of the low-pass filter 16. The peak detector circuit 30 is adapted to convert, as seen from the time chart shown in FIG. 7, the feed-through signal $\underline{b}$ outputted from the low-pass filter 15 into a sweeping waveform 206. On the other hand, the peak detector circuit 31 converts, as seen from FIG. 7, the pixel signal $\underline{c}$ developed from the low-pass filter 16 into a sweeping waveform 306. Those sweeping waveforms 206 and 306 follow, as seen FIG. 7, the peaks of the input signals 202 and 302, respectively, and then slowly attenuate. In this manner, it is possible to obtain the substantial peak value of the pixel signal $\underline{c}$ outputted from the low-pass filter 16 or the corresponding signal. It is noted that such waveform operations are referred to as "averaging" and such waveforms are referred to as "sweeping waveforms". The sample and hold circuits 19 and 20, which succeed the circuits 30 and 31, respectively, sample simultaneously the sweeping waveforms 206 and 306 in response to the pulse 104, and hold the values thus sampled therein, respectively.

Figure 9:
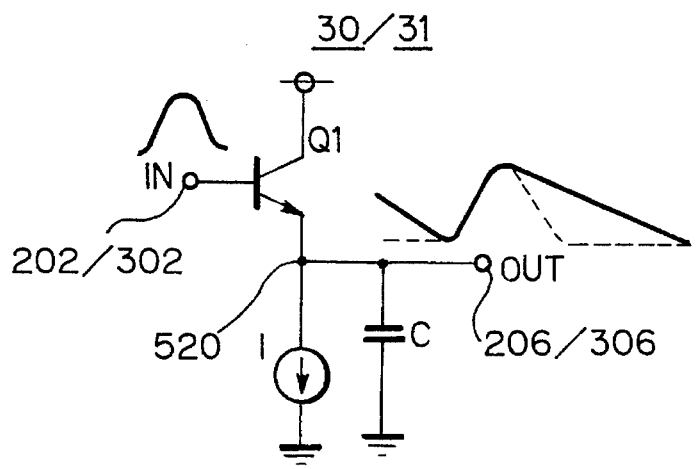
FIG. 9 is a functional circuit diagram showing a peak detecting circuit by way of example in the CCD signal read-out circuit shown in FIG. 6.
Figure 10:
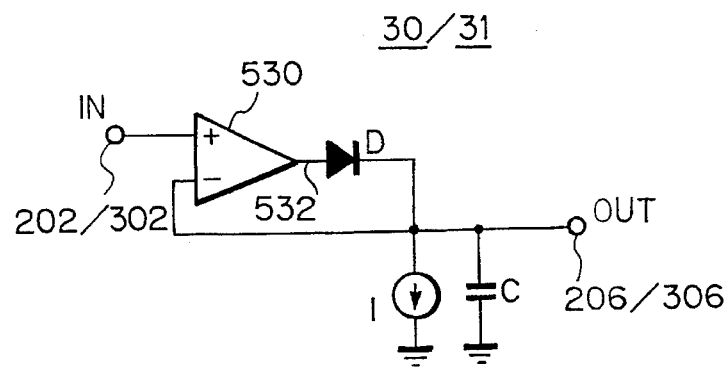
FIG. 10 is a functional circuit diagram showing a peak detecting circuit further by way of example in the CCD signal read-out circuit shown in FIG. 6.

FIGS. 9 and 10 show specific examples of a circuit applicable to the peak detecting circuits 30 and 31. A circuit shown in FIG. 9 comprises a transistor Q1 for amplifying input signals 202 or 302, which has an emitter 520 connected to the output terminals 206 or 306. Further connected to the emitter 520 are a constant current source I and a capacitor C. On the other hand, a circuit shown in FIG. 10 comprises a differential amplifier 530 for amplifying input signals 202 or 302 on a differential basis, which amplifier has an output 532 connected through a diode D to the output terminals 206 or 306. The output 532 are connected further to the constant current source I and the capacitor C, and an inverted input (−) of the differential amplifier 530 as well. The peak detecting circuit 30 or 31 shown in FIG. 9 amplifies the input signal IN with the transistor Q1, so that the capacitor C is rapidly charged. The capacitor C gradually discharges as the peak value of the input signal IN decreases, so that the sweeping waveform 206 or 306 having a specified slope appears on the output OUT. The peak detecting circuit 30 or 31 shown in FIG. 10 amplifies the input signal IN with the amplifier 530, so that the capacitor C is rapidly charged. Other points are the same as the circuit shown in FIG. 9.

Figure 7:
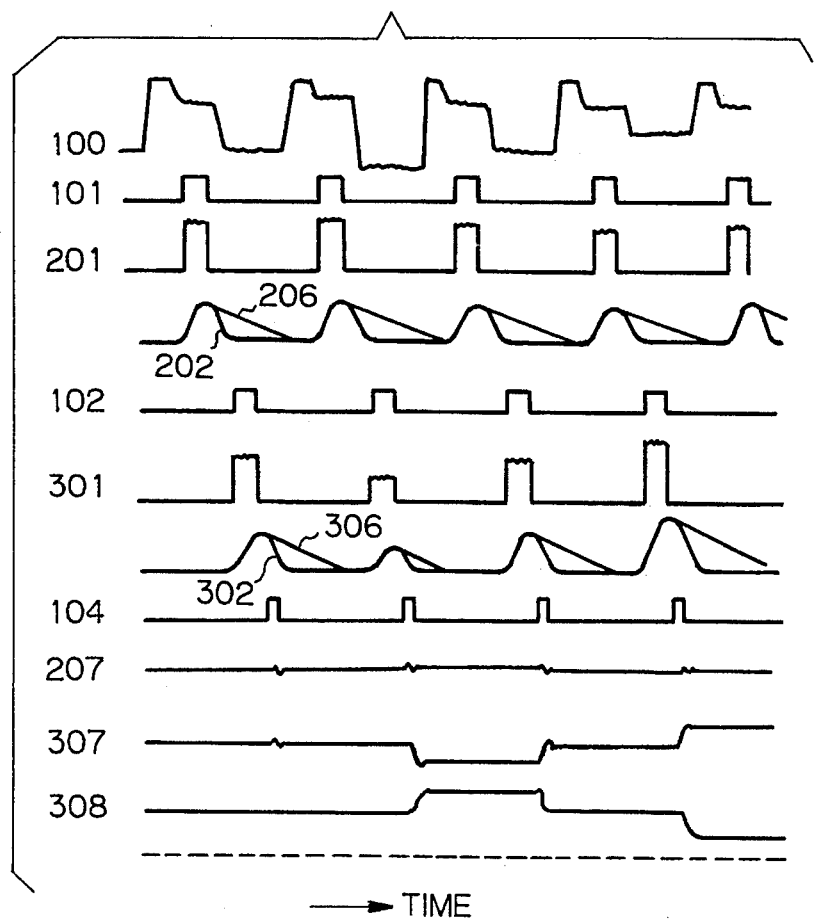
FIG. 7 is a time chart useful for understanding the operation of the CCD signal read-out circuit shown in FIG. 6.
Figure 8:
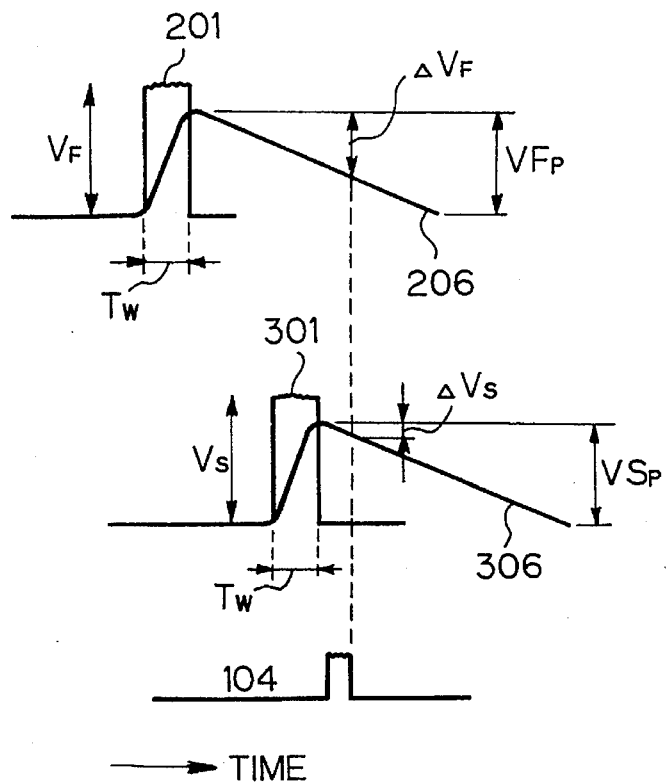
FIG. 8 plots an example of the waveforms appearing in the CCD signal read-out circuit shown in FIG. 6.

More specifically with reference to FIG. 8, when the input signals 201 and 301 shown in FIG. 7 are the same as one another in-pulse width Tw, they are equivalent to the output signals $\underline{b}$ and $\underline{c}$ of the charge-coupled device 11, respectively, since their peak values VFp and VSp are proportional to the averages (denoted by the symbol "18") of the peak values VF and VS of the input signals IN, respectively, as defined by expression (1). At the time point when the sample and hold is carried out actually, the output signals are lowered by $\Delta VF$ and $\Delta VS$ from the peak values, respectively.

$$VFp = \alpha \tilde{VF} \quad (1)$$
$$VSp = \alpha \tilde{VS}$$

From expression (1), the voltage, Vout, on the output 308 of the differential amplifier 21 is given by expression (2).

$$Vout=(VFp-\Delta VF)-(VSp-\Delta VS)=VFp-VSp-(\Delta VF-\Delta VS)\propto \tilde{V}F-\tilde{V}S \quad (2)$$

Since the item ($\Delta VF - \Delta VS$) in expression (2) takes a constant value, the output voltage, Vout, is proportional to the difference between the averages of the peak values VF and VS of the input signals IN. Therefore, the circuit 29 shown in FIG. 6 produces, in a similar fashion to that of the circuit 10 shown in FIG. 1, a difference between the feed-through signal b and the pixel signal c on the output 308.

Figure 11:
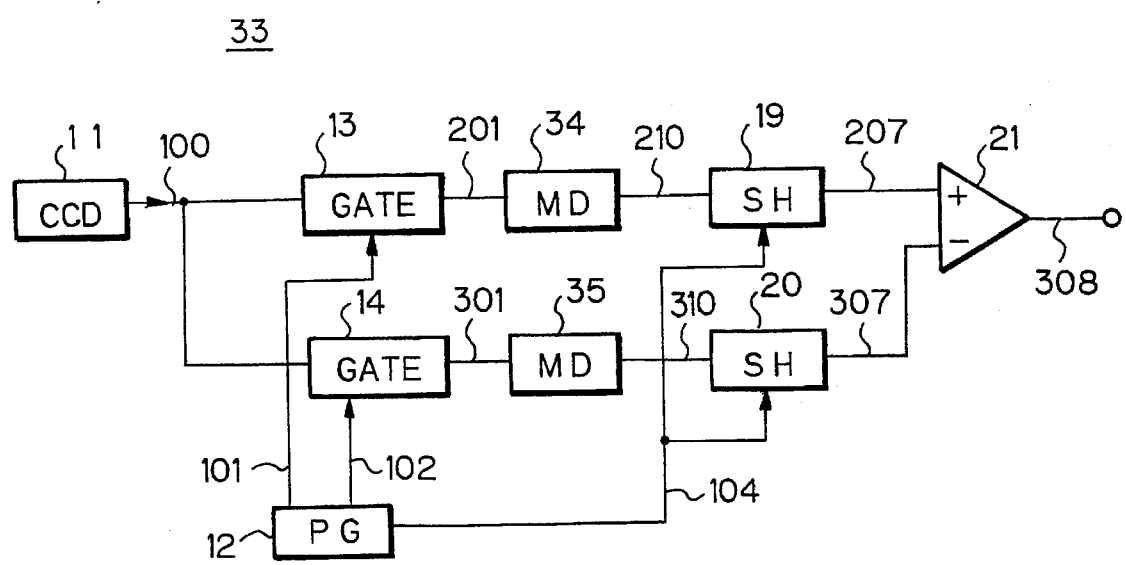
FIG. 11 is a schematic block diagram, similar to FIG. 1, showing a still further alternative embodiment of the CCD signal read-out circuit according to the present invention.
Figure 12:
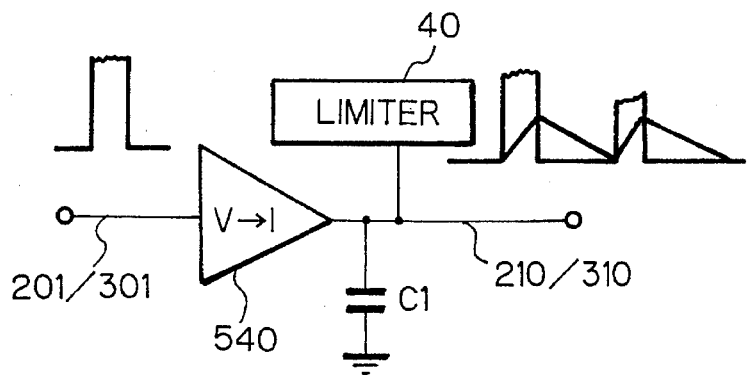
FIG. 12 is a schematic diagram exemplifying a functional circuit structure of a mean value detection circuit in the CCD signal read-out circuit shown in FIG. 11.
Figure 15:
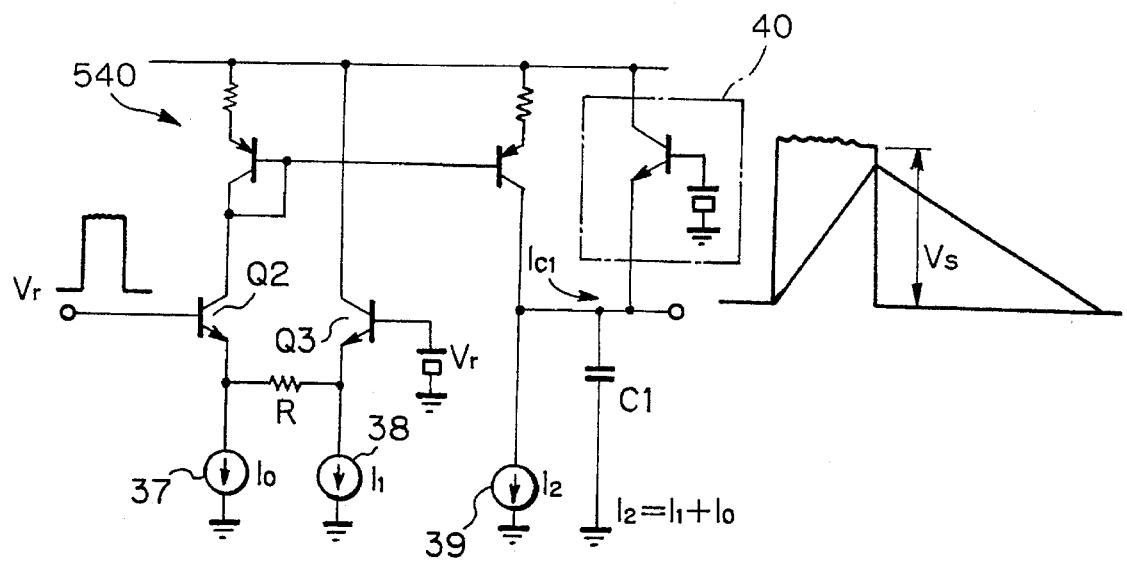
FIG. 15 is a schematic circuit diagram showing a specific example of the integrator circuit having a limiter shown in FIG. 12.
Figure 17:
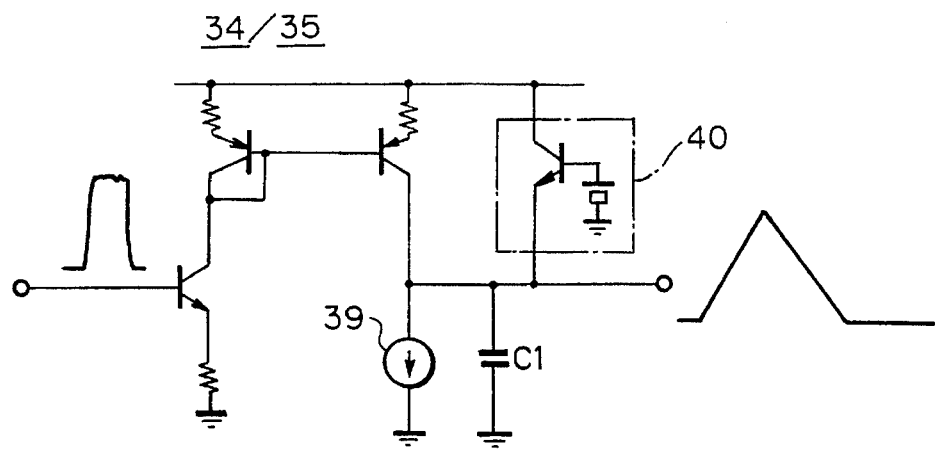
FIG. 17 is a schematic circuit diagram showing another example of the integrator circuit having a limiter shown in FIG. 12.

FIG. 11 is a schematic block diagram of a further alternative embodiment of the CCD signal read-out circuit 33 according to the present invention. The CCD signal read-out circuit 33 is the same as the read-out circuit 29 except, instead of the low-pass filters 15 and 16 and the peak detector circuits 30 and 31 of the circuit 29 in FIG. 6 there is provided such an arrangement that average or mean detector circuits (MD) 34 and 35 are provided. As seen from the circuit shown in FIG. 12, the average detector circuits 34 and 35 comprise a converter 540 for converting the input voltage 201 or 301 to a corresponding current, a limiter 40 and a capacitor C1. The average detector circuits 34 and 35 are arranged to integrate the input voltage 201 or 301 and convert the same into a sweeping signal having a specified slope. FIGS. 15 and 17 show each an example of an integrator circuit having a limiter shown in FIG. 12.

Figure 16:
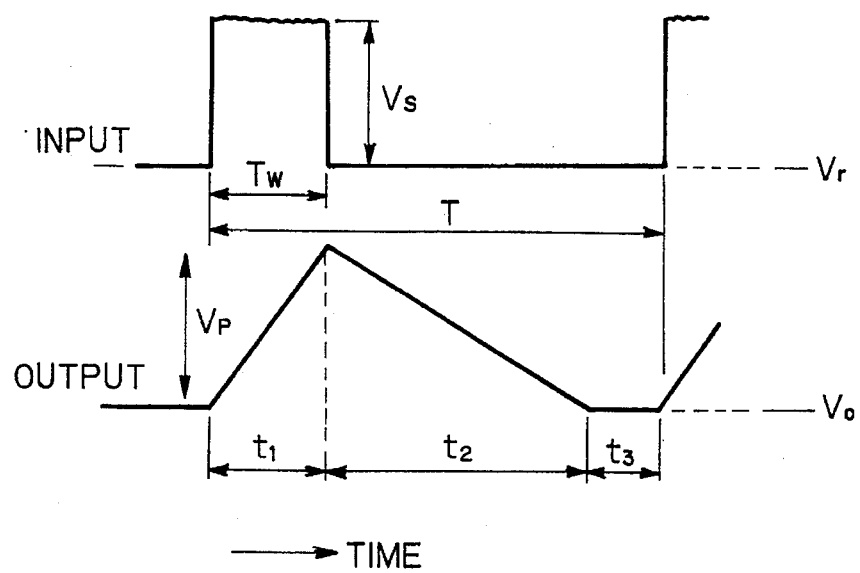
FIG. 16 is a time chart useful for understanding the operation of the circuit shown in FIG. 15.

In the integrator circuit shown in FIG. 15, the circuit including transistors Q2 and Q3 constitutes a voltage-to-current converting circuit 540, which has an output connected to a limiter 40. The limiter 40 serves to set up a starting voltage, at which the capacitor C1 starts charging, to a predetermined value. Specifically, it is assumed that the currents of constant current sources 37, 38 and 39 are given with $I_0$, $I_1$ and $I_2$, respectively, where $I_2 = I_0 + I_1$. Referring to the time chart of FIG. 16, during a period $t_1$, the input voltage Vs causes the capacitor C1 to be charged with a current $I_{c1}=V_s/R-I_0$. During another period $t_2$ the capacitor C1 discharges where the discharge current is $I_{c1}=-I_0$. During still another period $t_3$ the limiter 40 turns on to maintain a constant voltage $V_0$.

Figure 13:
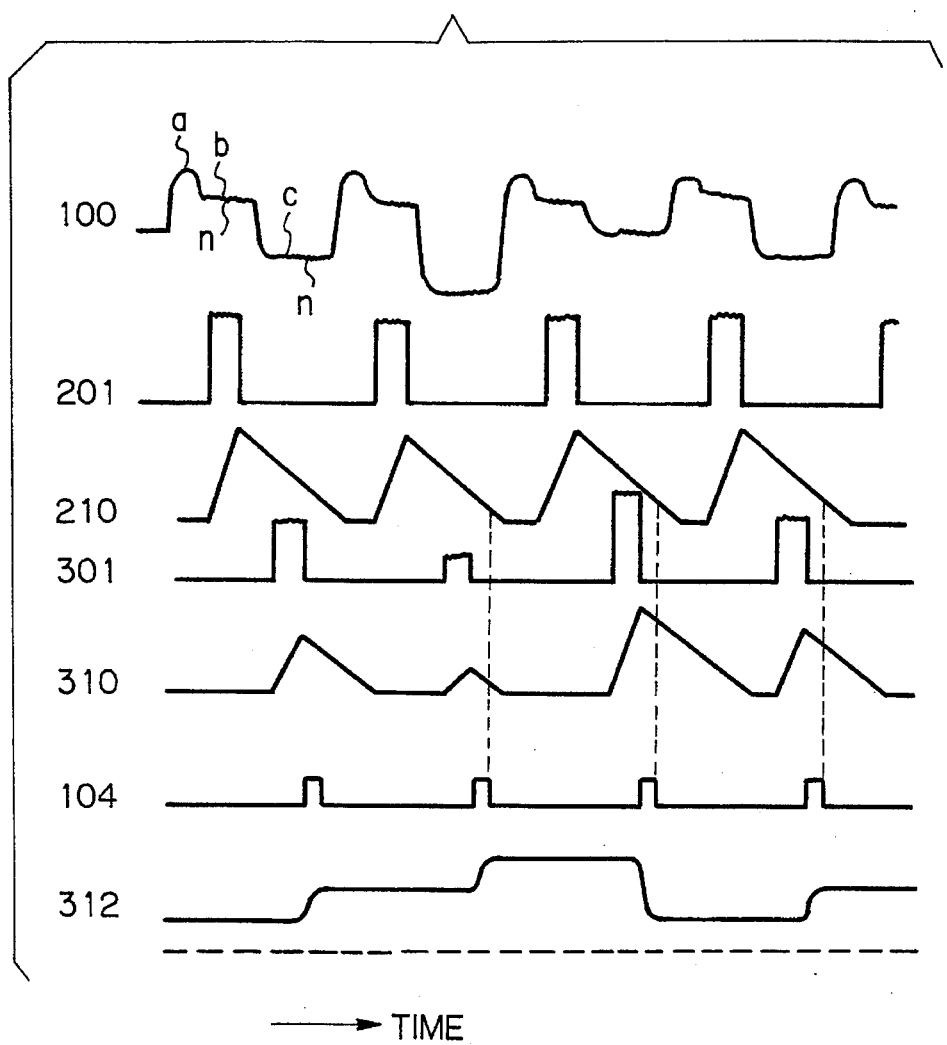
FIG. 13 is a time chart useful for understanding the operation of the CCD signal read-out circuit shown in FIG. 11.
Figure 14:
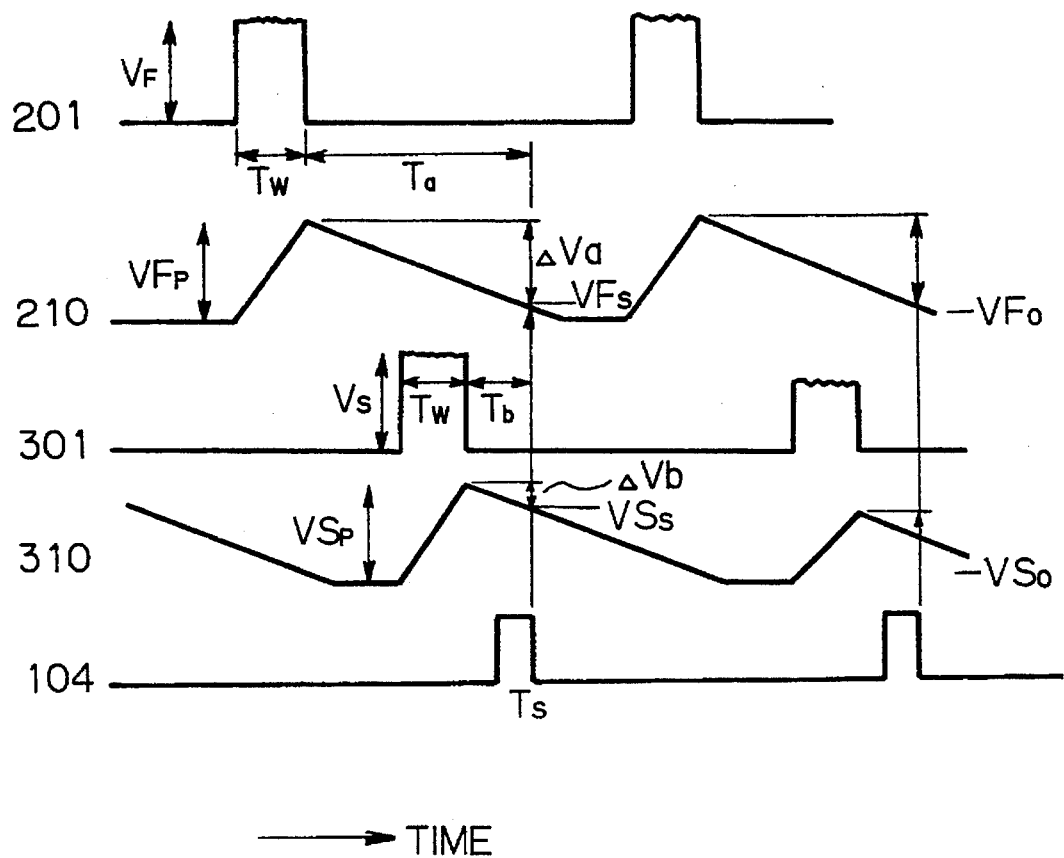
FIG. 14 shows an example of the waveforms appearing in the CCD signal read-out circuit shown in FIG. 11.

As seen from the time chart shown in FIG. 13, the feed-through signal b and the pixel signal c are converted into the sweeping signals 210 and 310 by the average detector circuits 34 and 35, respectively. The sample and hold circuits 19 and 20 sample simultaneously the sweeping signals 210 and 310 in response to the pulse 104, and hold the values thus sampled therein, respectively. The difference between the outputs 207 and 307 of the sample and hold circuits 19 and 20, respectively, is outputted from the output 308 of the differential amplifier 21. Referring to the time chart shown in FIG. 14, the following expression (3) is given.

$$VFp = (TW/CR) \cdot \tilde{VF} - I_o \cdot TW/C = k\tilde{VF} - K \quad (3)$$
$$VSp = (TW/CR) \cdot \tilde{VS} - I_o \cdot TW/C = k\tilde{VS} - K$$

where k and K are a constant.

The potentials VFS and VSS at the time of sampling are expressed as follows:

$$VFS=VF_0+VFp-\Delta Va \quad \Delta Va=I_0 \, Ta/c$$

$$VSS=VS_0+VSp-\Delta Vb \quad \Delta Vb=I_0 \, Tb/c$$

where $\Delta Va$ and $\Delta Vb$ are a constant.

Hence, the output voltage Vout on the output 308 of the differential amplifier 21 is expressed by the following expression (4):

$$Vout=VFS-VSS=VFp-VSp+A=k(\tilde{VF}-\tilde{VS})+A \quad (4)$$

where $A=VF_0-VS_0-\Delta Va+\Delta Vb$ is a constant.

In a similar fashion to that of the circuit 29 of the embodiment shown in FIG. 6, the output voltage on the output 308 of the differential amplifier 21 of the CCD signal read-out circuit 33 shown in FIG. 11 is expressed by the following equation (5):

$$Vout \propto \tilde{V}F-\tilde{V}S \quad (5)$$

This is the similar as to the matter of the average or mean detector circuits 34 and 35 shown in FIG. 17.

Figure 18:
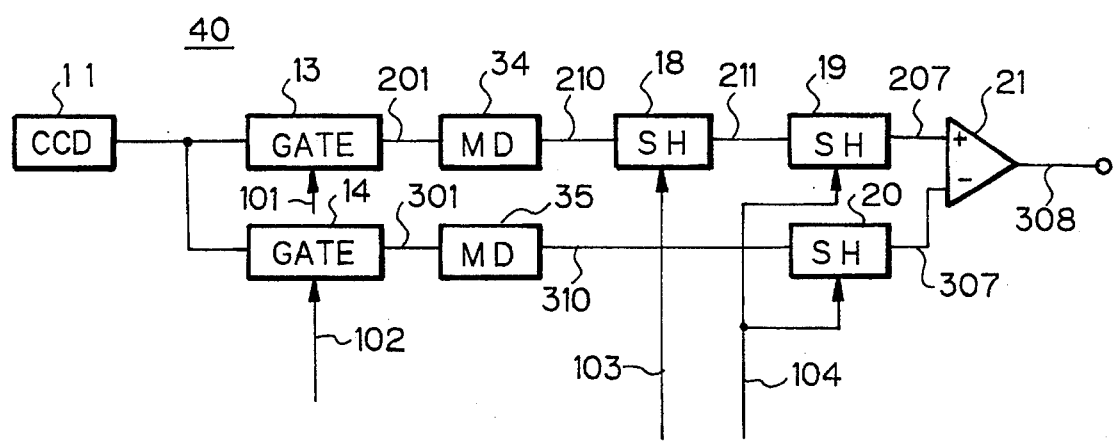
FIG. 18 is a schematic block diagram illustrating a part of a still further alternative embodiment of the CCD signal read-out circuit according to the present invention.

FIG. 18 shows part of a still further alternative embodiment of the CCD signal read-out circuit 40 according to the present invention. It may be interpreted that the portions not illustrated in FIG. 18 are the same as the arrangement of the embodiments aforementioned. The CCD signal read-out circuit 40 is different from the circuit 33 shown in FIG. 11 in the point that a sample and hold circuit 18 is provided at the output 210 of the mean detector circuits 34, which has an output 211 connected to the sample and hold circuit 19. The sample and hold circuit 19 receives the clamp pulse 103 from the pulse generating circuit 12. In this case, the mean detector circuits 34 and 35 may be implemented to include a low-pass filter and a peak detector circuit.

Figure 19:
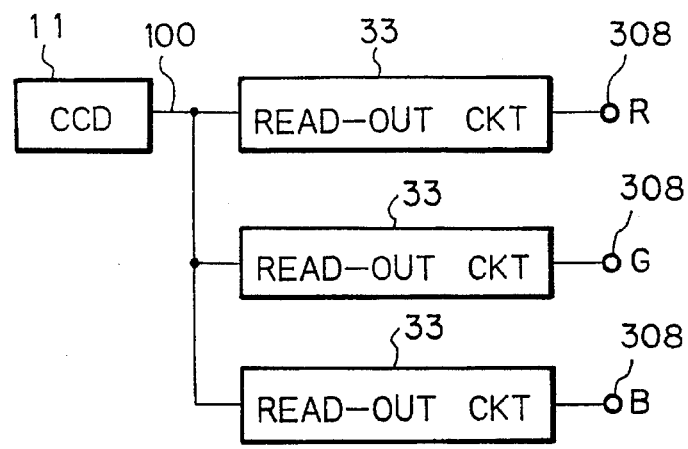
FIG. 19 is a schematic block diagram showing an embodiment of the CCD signal read-out circuit, in which the present invention is applied to a color image sensor.

In an application of the color image sensor, the charge-coupled device 11 is adapted to have a three-primary color, optical filter. In this case, the the color image sensor may be arranged in such a manner that three CCD signal read-out circuits 33 as shown in FIG. 11 are provided corresponding to three primary color signals R, G and B. FIG. 19 shows an example in which the CCD signal read-out circuit according to the present invention is applied to the color image sensor as mentioned above. According to the arrangement shown in FIG. 19, the gates 13 and 14, which are provided for each of the CCD signal read-out circuits 33, are enabled in time by reading out the three primary color signals R, G and B from the color charge-coupled device 11. As a result, the respective CCD signal read-out circuits 33 output on their output 308 associated one of the primary color signals from which the reset noise and the 1/f noise are suppressed.

Figure 20:
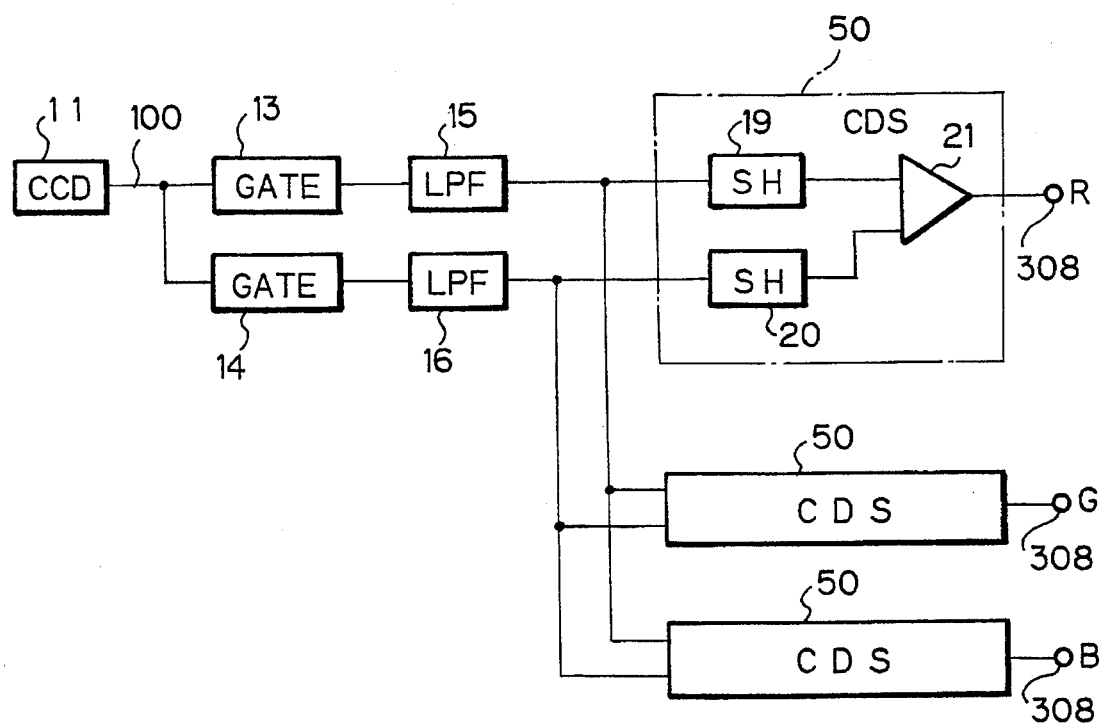
FIG. 20 is a schematic block diagram showing an alternative embodiment of the CCD signal read-out circuit, in which the present invention is applied to a color image sensor.

FIG. 20 shows another example in which the charge-coupled device 11 is a color image sensor, and the gates gates 13 and 14 and the low-pass filters 15 and 16 are provided on a common basis to the three primary color signals. For example, R, G and B, and three correlated double sampling circuits 50 are provided exclusively for the respective, three primary color signals R, G and B. According to the arrangement shown in FIG. 20, the sample and hold circuits 19 and 20 included in each of the correlated double sampling circuits 50 are driven in time with the associated three primary color signals R, G and B. As a result, the correlated double sampling circuits 50 produce on their output 308 associated one of the primary color signals from which the reset noise and the 1/f noise are suppressed.

According to the embodiments described above, there is provided an arrangement in which the entered pixel signals are subjected to low-pass filtering or is integrated, and then the resultant signals are sampled and held. This arrangement involves less degradation of S/N ratio which would otherwise be due to aliasing of the high-frequency noises. Further, according to these embodiments, the feed-through signal and the pixel signal are separated by the gate circuits 13 and 14 and then be subjected to the low-pass filtering or integrated. This arrangement involves no degradation of a noise suppression capability of the correlated double sampling which would otherwise be caused by distortion of the waveforms. Furthermore, in an application of the peak detection or the integration, it is possible to remarkably ease precision on the timing of the sampling. In addition, the feed-through signal and the pixel signal, which are subjected to the peak detection or integration process, are permitted to be sampled and held, thereby contributing to simplification of the circuit arrangement.

Figure 21:
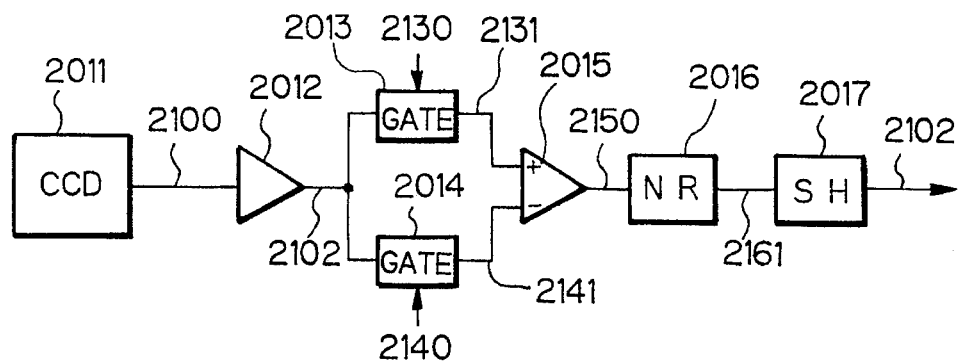
FIG. 21 is a functional block diagram showing another embodiment of the CCD signal read-out circuit according to the present invention.

Now referring to FIG. 21, which shows another embodiment of the CCD signal read-out circuit 2010 according to the present invention, the illustrative embodiment of the circuit 2010 serves as a noise reduction circuit for eliminating aliasing of high-frequency noises from image signals outputted from a solid state device 2011. The CCD signal read-out circuit 2010 extracts the level during a feed-through period and the level during a signal period by gate circuits 2013 and 2014, respectively, and evaluates a difference between the couple of levels, and thereafter low-pass filters or integrates the difference, thereby reducing a reset noise caused by the CCD 2011 and a low-frequency noise caused by an output amplifier thereof. Further, sampling and holding the signals, which are subjected to the filtering or the integration, make it possible to obtain images improved in S/N ratio, involving no aliasing of the high-frequency noises.

The solid state device 2011 is constituted of a charge-coupled device having a array of CCD photosensitive cells, such as photo-diodes, in which signals of electric charges carrying a field of photographic information are stored, and from which they are sequentially read out. The signals of electric charges thus read out are temporarily stored in a floating capacitor, not shown, and then transferred sequentially through a floating diffusion amplifier, also not shown, to an output 2100. As seen from FIG. 22, according to the present embodiment, the output signal 2100 generated from the solid state, charge-coupled device 2011 has in the repetitive pixel periods T a reset component $\underline{a}$, a feed-through level $\underline{b}$ containing noises Ni, and a signal level $\underline{c}$ containing noises Ni, where the suffix $\underline{i}$ is a positive integer corresponding to the pixel number. The noises Ni include a correlated reset noise, a low-frequency fluctuating noise (1/f) from the floating diffusion amplifier and a correlated high-frequency noise. The charge-coupled device 2011 has an output 2100 connected to an amplifier 2012, which is adapted to amplify the output signal 2100 of the charge-coupled device 2011 to a level appropriate for processing. The amplifier 2012 has an output 2102 connected to gate circuits 2013 and 2014.

The gate circuits 2013 and 2014 extract the signal levels $\underline{b}$ and $\underline{c}$ of the output 2100 of the amplifier 2012 in time with gate pulses 2130 and 2140 to separate them into a feed-through level of signal 2131 inherently including the noise Ni and a pixel signal 2141 also inherently including the noise Ni, respectively. These signals are passed separately to a differential amplifier 2015. The gate pulses 2130 and 2140 are synchronized with a feed-through period $\underline{b}$ and a signal period $\underline{c}$, respectively, as understood from FIG. 22, and are substantially the same as one another in pulse duration. The differential amplifier 2015 receives on the non-inverted and inverted input terminals (+, −) the feed-through level of signal 2131 and the pixel signal 2141, which will in turn be transferred, with the latter inverted, to a noise elimination or reduction circuit (NR) 2016 in the form of a serial signal. Alternatively, of course, such an arrangement may be provided that the feed-through level of signal 2131 is inverted whereas the pixel signal 2141 is maintained in its polarity.

The noise reduction circuit 2016 serves to cancel the noises (Ni, −Ni) in opposite phase involved in the output signal 2150 of the differential amplifier 2015, and in addition reduce the high-frequency noise. According to the present embodiment, as will be described later, the noise elimination circuit 2016 is implemented with either a low-pass filter or an integrator. The noise elimination circuit 2016 has an output 2161 connected to an input of a signal hold circuit 2017. The signal hold circuit 2017 is constituted of a sample and hold circuit which is adapted to sample and hold the output signal of the noise elimination circuit 2016 and to pass the resultant signal to the output 2101 thereof. The signal hold circuit 2017 may be omitted.

Figure 23A:
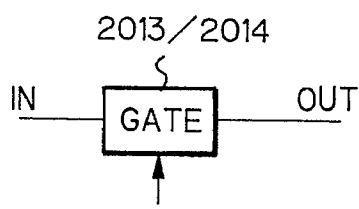
FIGS. 23A and 23B are functional block diagrams showing an example of the structure of a gate circuit in the CCD signal read-out circuit shown in FIG. 21.
Figure 23B:
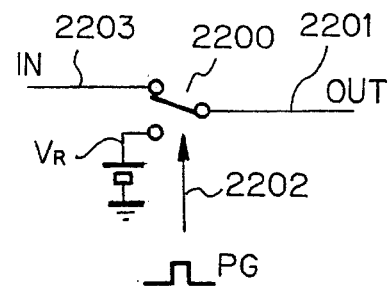
Figure 24:
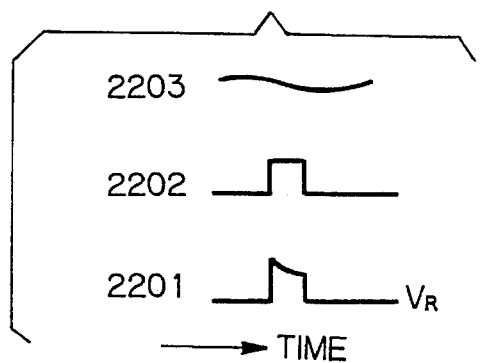
FIG. 24 is a time chart useful for understanding the operation of the gate circuit shown in FIGS. 23A and 23B.
Figure 25:
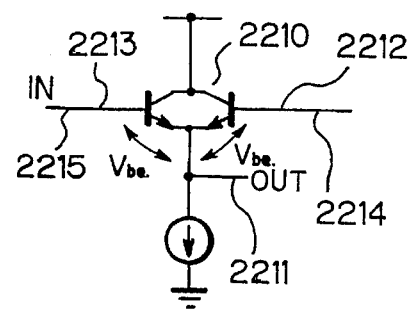
FIG. 25 is a functional block diagram showing another example of the structure of a gate circuit in the CCD signal read-out circuit shown in FIG. 21.
Figure 26:
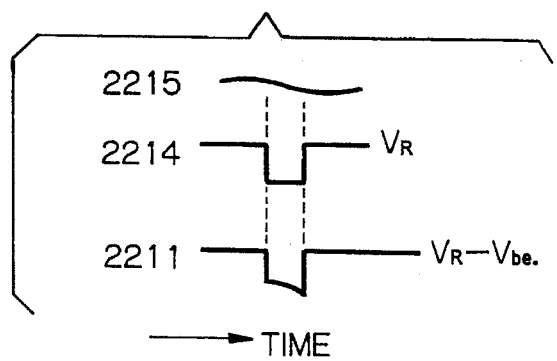
FIG. 26 is a time chart useful for understanding the operation of the gate circuit shown in FIG. 25.

FIGS. 23A, 23B and 25 show examples of the structure of the gate circuits 2013 and 2014 in the CCD signal read-out circuit shown in FIG. 21. FIGS. 24 and 26 show time charts useful for understanding the operations of the gate circuits shown in FIGS. 23 and 25, respectively. FIG. 23A shows schematically a typical illustration of the gate circuits 2013 or 2014, and FIG. 23B exemplarily the basic arrangement of constituents of the gate circuits 2013 or 2014. A switch 2200 normally takes its connecting state such that a constant voltage VR is applied to an output terminal 2201. Upon receipt of the gate pulse 2202, the switch 2200 is operative to convey an input signal appearing on an input terminal (IN) 2203 to an output terminal 2201. According to the exemplery structure of the gate circuit shown in FIG. 25, there is provided a complementary emitter follower 2210 having its base electrodes 2212 and 2213, to which the gate pulse 2214 and the signal 2215 are applied, respectively. The gate pulse 2214 is normally of a constant voltage VR which is higher in level than the signal 2215. Denoting the common base-emitter voltage Vbe, the output signal 2211 becomes a voltage substantially equal to VR−Vbe. The gate pulse 2214 applied and the potential of the base electrode 2212 lowering from that of the base electrode 2213 cause the output signal to correspond to the signal 2215, which will in turn be developed on the output port 2211. Thus, the gate circuits 13 and 14 extract the input signals.

Figure 27A:
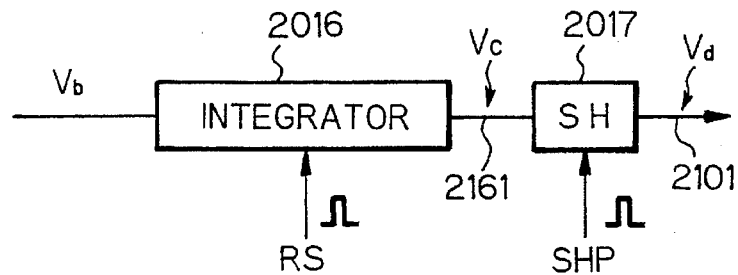
FIG. 27A is a functional block diagram showing the basic arrangement of a noise eliminating circuit and a signal holding circuit in the CCD signal read-out circuit shown in FIG. 21.
Figure 27B:
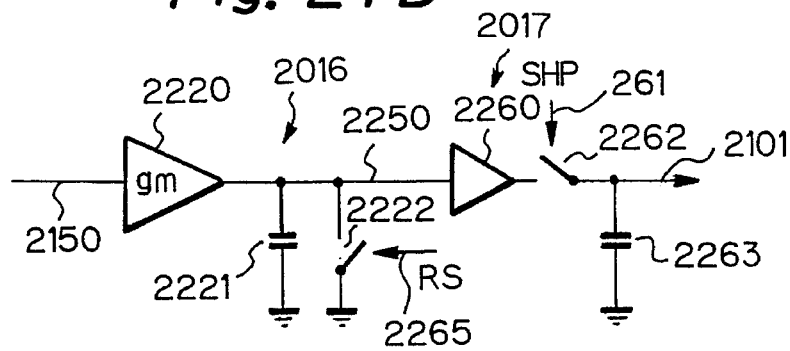
FIG. 27B is a schematic circuit diagram showing an example of an embodied structure from the basic arrangement of the noise eliminating circuit and the signal holding circuit shown in FIG. 27A.
Figure 28:
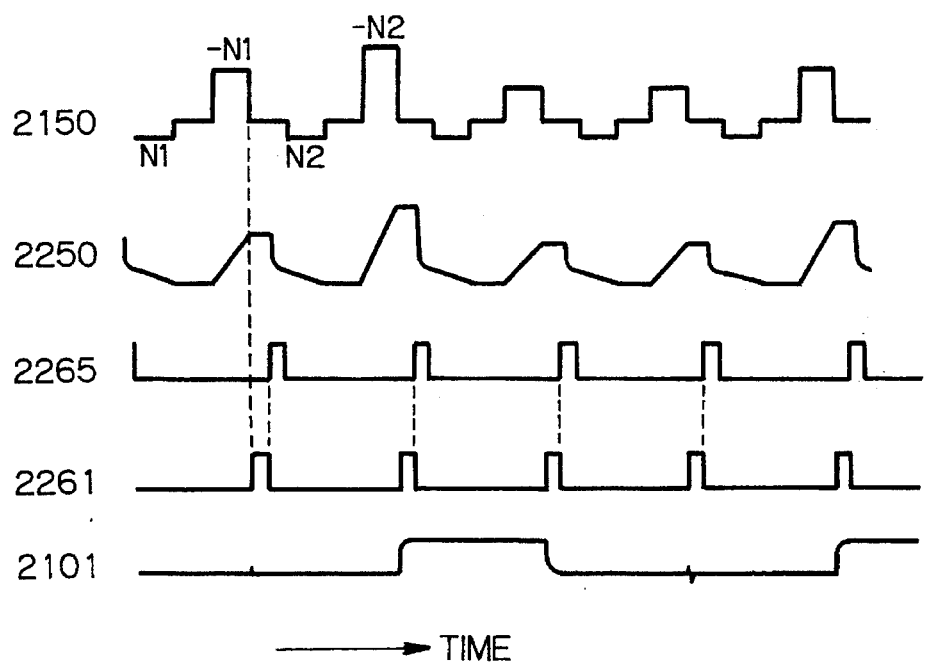
FIG. 28 is a time chart useful for understanding the operation of the embodiments shown in FIGS. 27A and 27B.

FIG. 27A shows an example in which a noise elimination circuit 2016 shown in FIG. 21 is implemented by an integrator circuit. The integrator circuit 2016 has an output 2161 connected to the following signal holding circuit 2017 in the CCD signal read-out circuit shown in FIG. 21. FIG. 28 is a time chart useful for understanding the operation of the embodiment shown in FIGS. 27A and 27B. FIG. 27A is a typical illustration of the integrator circuit 2016 and the signal holding circuit 2017, and FIG. 27B shows an example of an embodied structure of the basic arrangement of the integrator circuit 2016 and the signal holding circuit 2017 shown in FIG. 27A. In the integrator circuit 2016, an amplifier 2220 of an amplification factor gm receives a CCD signal 2150 from the the differential amplifier 2015 shown in FIG. 21 and amplifies the same to supply the corresponding current to a capacitor 2221. The capacitor 2221 is charged with the signal 2150 during a period of time while a reset switch 2222 is opened. A signal 2250, representative of the charged voltage at that time will be free from the reset noises by integrating the levels of the feed-through period b and the signal period c, which include the same amount of reset noises but are mutually opposite in polarity. In addition, the integration allows the high-frequency noises to be averaged and reduced significantly.

Thus, the signals with the noises (Ni, −Ni) in opposite phase cancelled and the high-frequency noises reduced are delivered to the signal holding circuit 2017. This signal conversion is referred to as "averaging". In this manner, the integrator circuit makes it possible to reduce the high-frequency noises together with the reset noises.

In the succeeding signal hold circuit 2017, an amplifier 2260 amplifies the input signal 2250 to charge a capacitor 2263 through a switch 2262 when the latter is closed in response to a sample and hold pulse (SHP) 2261. The charged wave of signal 2101 is outputted as the system output from the output port 2101. After the lapse of one pixel period T since the signal 2101 is outputted, a reset pulse 2265 is generated so that the reset switch 2222 is closed. As a result, the capacitor 2221 of the integrator circuit 2016 is discharged or cleared. In this manner, the integrator circuit 2016 is operative to remove the high-frequency noise from its output signal. Therefore, the sample and hold accomplished by the succeeding signal hold circuit 2017 involves no generation of the folding noise.

Figure 34:
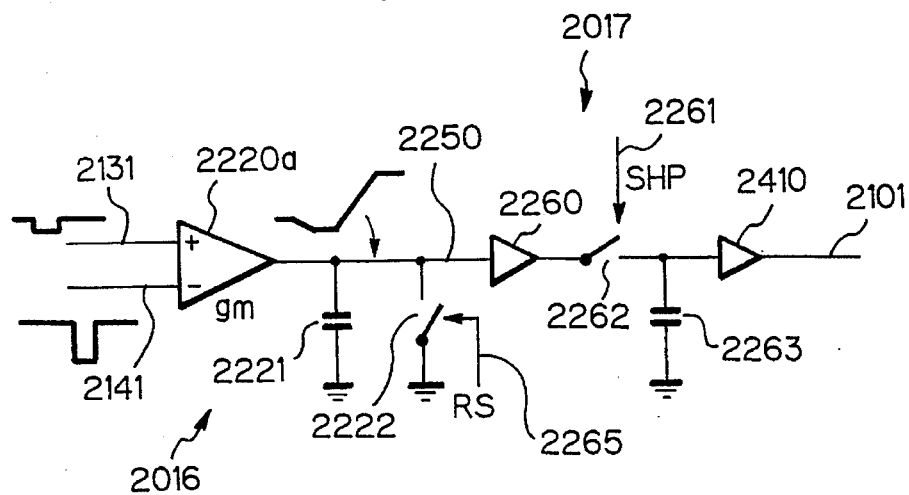
FIG. 34 is a schematic diagram showing the basic arrangement of a noise eliminator circuit which is implemented by replacing the integrator circuit with a differential amplifier.

In the noise removal or eliminator circuit 2016, when implemented in the form of integrator circuit, the amplifier 2220 shown in FIG. 27B may be replaced by a differential amplifier 2220a having differential inputs as shown in FIG. 34. This example is shown in FIG, 34. The amplifier 2220a has its differential inputs of a non-inverted input (+) and an inverted input (−) to which the outputs 2131 and 2141 of the gate circuits 2013 and 2014 are connected, respectively. This arrangement permits the differential amplifier 2015 shown in FIG. 21 to be omitted.

Figure 29:
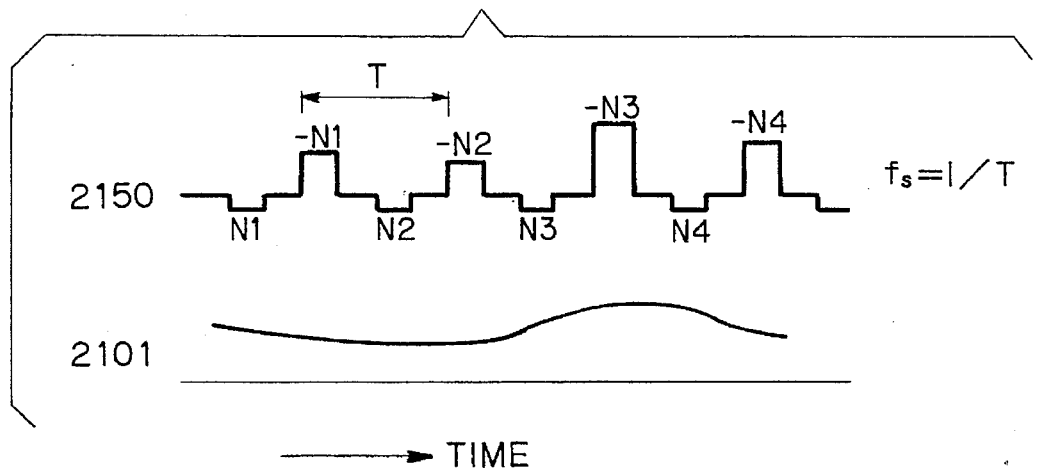
FIG. 29 is a time chart useful for understanding the operation of another example of the basic arrangement of the noise eliminating circuit in the CCD signal read-out circuit shown in FIG. 21.

FIG. 29 shows signal waves in an application where the noise removal circuit 2016 is implemented with a low-pass filter. The use of the low-pass filter for the noise removal circuit 2016 makes it possible to smooth the signal components and in addition reduce the noise component through setting its band to not more than one half of the sampling frequency $f_s = 1/T$ of the signal hold circuit 2017. In other words, in a similar fashion to that of the arrangement of the noise removal circuit 2016 when implemented in the form of integrator circuit, the averaging of the CCD signal 2150 is carried out by the low-pass filter, thereby outputting the read-out signal 2101 involving less noise component. In an application where the noise removal circuit 2016 includes such a low-pass filter, the signal hold circuit 2017 may be ommited. Further, the filter 2016 may be equipped with a trap for removing a frequency which is equal to a carrier component frequency $(f_s)$ of the sample and hold circuit 2017.

Figure 22:
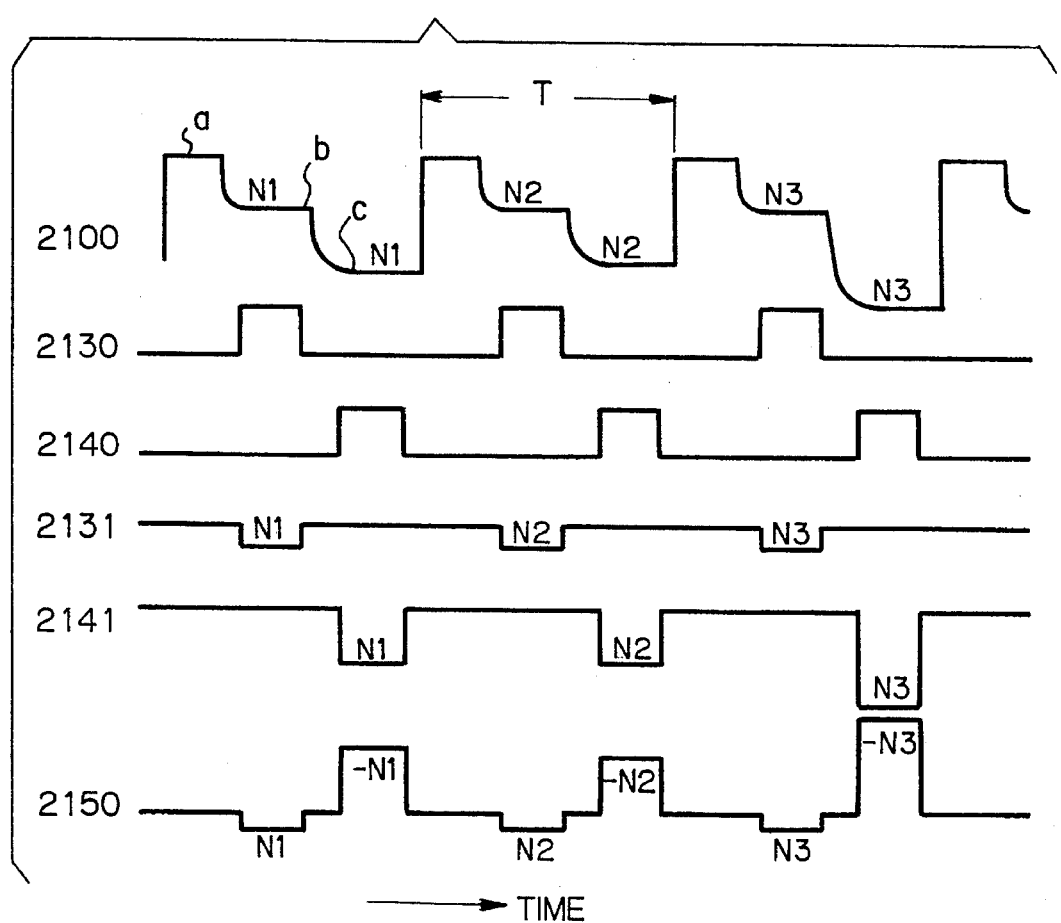
FIG. 22 is a time chart useful for understanding the operation of the CCD signal read-out circuit shown in FIG. 21.

In operation, with the CCD signal read-out circuit 2010 as shown in FIG. 21, the output signal 2100 from the solid state device 2011 is amplified by the amplifier 2012 and then applied to the gate circuits 2013 and 2014 so that parts of the signals are extracted in response to the gate pulses 2130 and 2140, respectively. The extracted signals are fed to the input terminals "+" and "−" of the differential amplifier 2015 in the form of two streams of signals 2131 and 2141, respectively. Upon receipt of the signals 2131 and 2141, the differential amplifier 2015 inverts the latter and combines the non-inverted and inverted signals into the serial signal 2150 as shown in FIG. 22. The noise removal circuit 2016 provides the averaging by means of low-pass filtering or integration. In other words, in the case of the integrator circuit, noises Ni in opposite phase of the input signal 2150 are cancelled and the high-frequency noise is reduced. The signal hold circuit 2017 samples and holds the output of the noise removal circuit 2016 to output the resultant read-out signal 2101.

According to the conventional correlated double sampling circuit, there are provided sample and hold circuits instead of the gate circuits 2013 and 2014 included in the embodiment of the invention. The gate circuits 2013 and 2014 in the instant embodiment are simpler in circuit structure than the sample and hold circuit. Further, the gate circuits 2013 and 2014 do not have capacitance. Thus, the use of the gate circuits 2013 and 2014 enables the system to be operative at higher speed.

Figure 30:
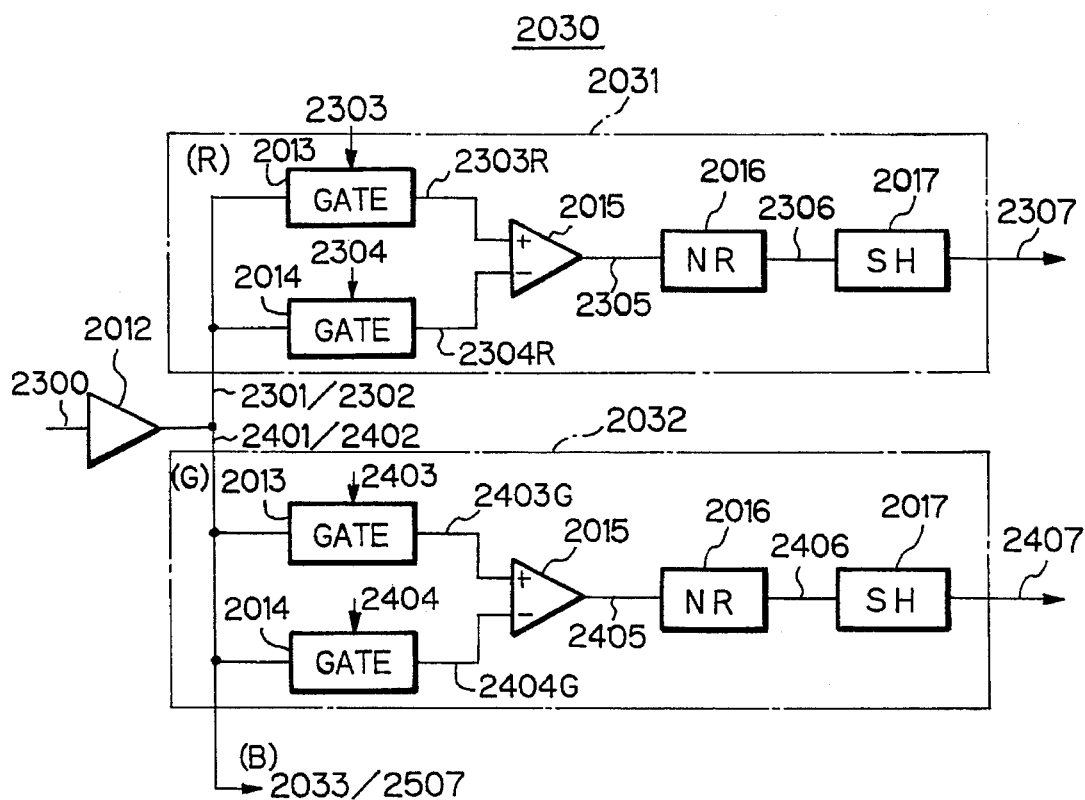
FIG. 30 is a functional block diagram showing an alternative embodiment of the CCD signal read-out circuit according to the present invention, wherein the CCD signal read-out circuits are provided separately for the associated color signal systems of the three primary color signals.
Figure 31:
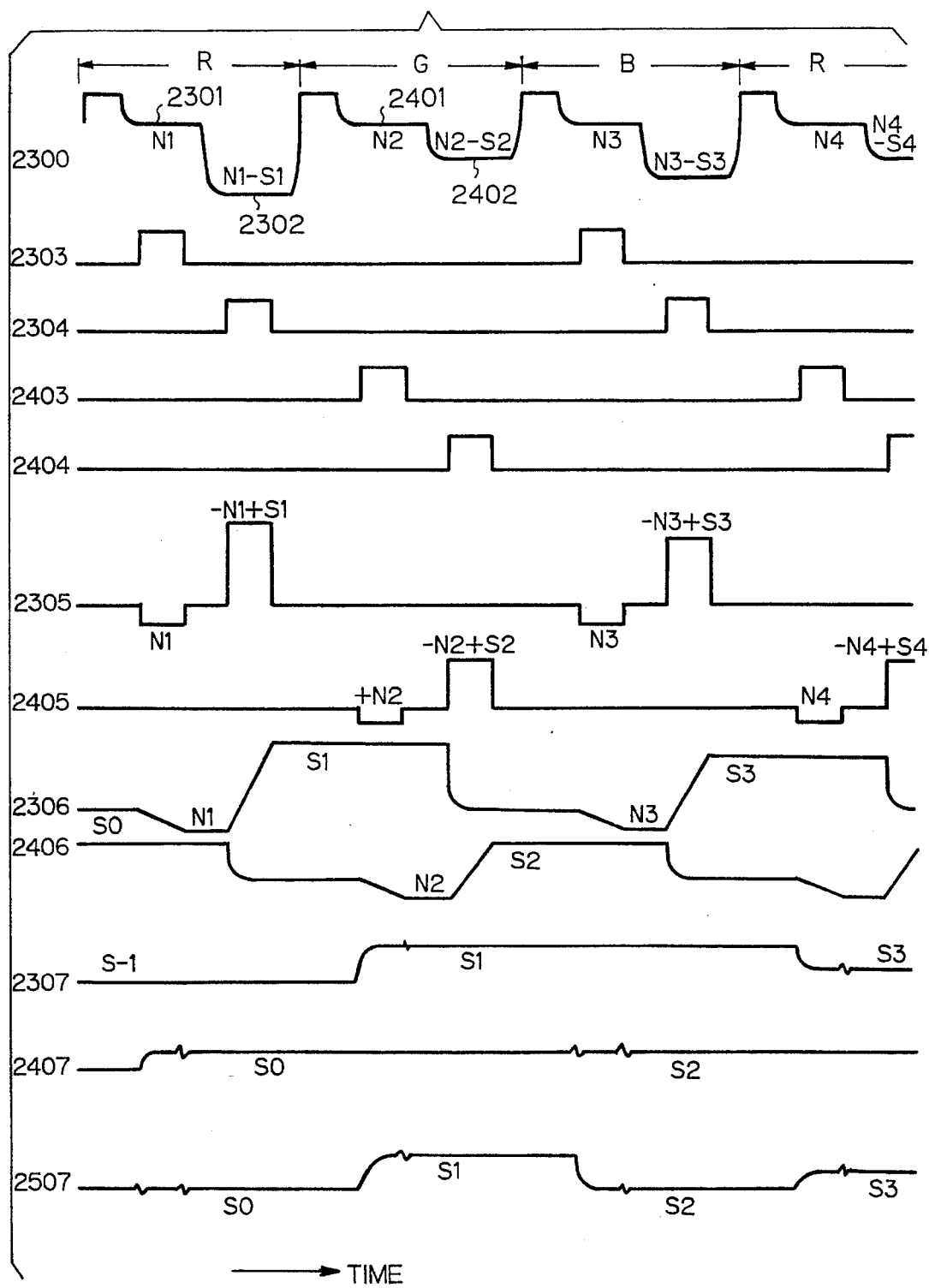
FIG. 31 is a time chart useful for understanding the operation of the CCD signal read-out circuit shown in FIG. 30.

In an application where the sol id state imaging device 2011 is of the type in which color signals of the three primary color components, red (R), green (G) and blue (B), are produced, for example, on a dot sequential basis, it is effective to provide separately the CCD read-out circuits for the associated color components. FIG. 30 shows an example wherein three CCD signal read-out circuits are provided separately for the associated color signal components of the three primary colors. FIG. 31 is a time chart useful for understanding the operation of the CCD signal read-out circuit shown in FIG. 30. Here, in the case where the solid state device 2011 is a color image sensor, as a matter of convenience for explanation, the color output signal is denoted by the reference number 2300. An amplifier 2012 amplifies the output signal 2300. To the output port of the amplifier 2012, there are connected the separate CCD signal read-out circuits for the associated color signal components R, G and B. Merely for simplicity, FIG. 30 shows the read-out circuit sub-blocks 2031 and 2032 only, and omits that of the read-out circuit block 2033 from being illustrated with the reference number 2033 given only. Those read-out circuit blocks 2031, 2032 and 2033 are the same as each other in structure and function. In the following figures, the like components are denoted by the same reference numbers as those of FIG. 21. According to the instant embodiment, the noise eliminator circuit 2016 is constituted of the integrator circuit. However, the integrator circuit may of course be replaced by the low-pass filter.

Referring to FIG. 31, it will be understood that with respect to the signal component R of the dot sequential color output signal 2300 of the charge coupled device, noise N1 of the feed-through level 2301 is superposed on a signal S1 of the signal level 2302. Likely, with respect to the signal compnent G, a signal S2 of the signal level 2402 involves noise NS of the feed-through level 2401. The output signal 2300 is passed via the amplifier 2012 to the gate circuits 2013 and 2014 of each of the read-out circuit blocks 2031, 2032 and 2033. In the sub-block 2031 for the R signal use, sampling pulses 2303 and 2304, which will be generated in time with part of the R signal extracted, are supplied to the gate circuits 2013 and 2014, respectively, so that R signals 2303R and 2304R, which are extracted in the gate circuits 2013 and 2014, respectively, are passed to a differential amplifier 2015. An output signal 2305 of the differential amplifier 2015 passes through the noise removal circuit 2016 to be an R signal 2306 involving no noise N1. The resulting R signal 2306 is fed to the signal hold circuit 2017 to produce an R compnent signal 2307.

Likely, in the sub-block 2032 for the G signal use, sampling pulses 2403 and 2404, which will be generated in the timing of the G signal extracted, are supplied to the gate circuits 2013 and 2014, respectively, so that G signals 2403G and 2404G, which are extracted in the gate circuits 2013 and 2014, respectively, are passed to a differential amplifier 2015. An output signal 2405 of the differential amplifier 2015 passes through the noise removal circuit 2016 to be a G component signal 2406 with noise N2 minimized. The resulting R signal 2406 is fed to the signal hold circuit 2017 to produce a G component signal 2407. This is the similar as to the matter of the operation of a B component signal regarding the sub-block 2033 for the B signal use. In this case, on the output 2507, not shown, there appears a B component signal not involving noise N3. In this manner, providing the three systems of signal read-out circuit in parallel for color signals R, G and B enables higher read-out speed than the single system of read-out circuit provided as shown in FIG. 21. For the individual read-out circuit sub-blocks 2031, 2032 and 2033, the requirements for the operational timings may be looser than these for the circuit arrangement of the single system of read-out circuit as shown in FIG. 21. This feature makes it possible to implement the system with a device which is operative at lower signalling rate.

According to the present embodiment, the charge-coupled device 2011 is of the type such from which color image signals are outputted on a dot sequential basis. In this case, it is effective that the circuit sub-blocks 2031, 2032 and 2033 are provided in correspondence with the color component signals R, G and B. However, according to the present invention, there is no need to always provide the blocks respectively for the associated color compnents. The circuitry may be arranged, for example, in such a manner that two sub-blocks 2031 and 2032 are provided to distribute portions of the image signal to both of the sub-blocks 2031 and 2032 during alternating pixel periods. Further, the image signal inputted from the charge-coupled device 2011 may not be the color image signal but a black and white one. Furthermore, the charge-coupled device 2011 may be different from the type in which the color image signals are outputted on a dot sequential basis, but a line sequential basis.

Figure 32:
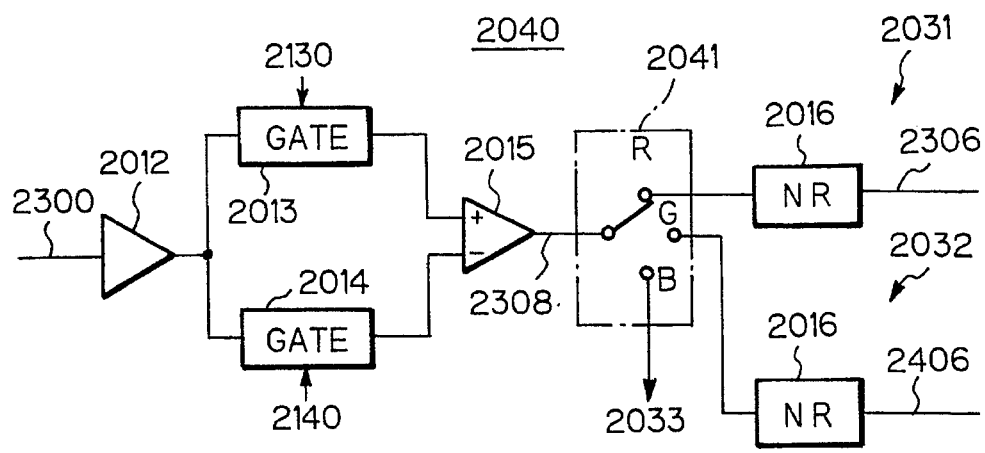
FIG. 32 is a schematic diagram showing the basic arrangement of the constituents of the CCD signal read-out circuit which is modified from that shown in FIG. 30 so that single section for receiving CCD signals is provided.

FIG. 32 shows the basic arrangement of constituents of the CCD signal read-out circuit which is modified from that shown in FIG. 30. In the signal read-out circuit 2040 shown in FIG. 32, the input subsection receiving the CCD signals from the output port of the amplifier 2012 and including the differential amplifier 2015 is common to the CCD sigals, and the portions following the output 2308 of the differential amplifier 2015 include three systems respectively provided for the three color compnents in a similar fashion to that of FIG. 30. For that purpose, the output 2308 of the differential amplifier 2015 is connected to a selector switch 2041 which serves as a selector circuit for selecting the three systems in synchronism with the color signals. Applied to the gate circuits 2013 and 2014 are, similar to the matter of the embodiment shown in FIG. 21, the gate pulses 2130 and 2140, respectively, which are synchronous with the pixel period. The portions successive to the outputs 2306 and 2406 of the noise removal circuit 2016 may be the similar to these of the embodiment shown in FIG. 30.

Figure 33:
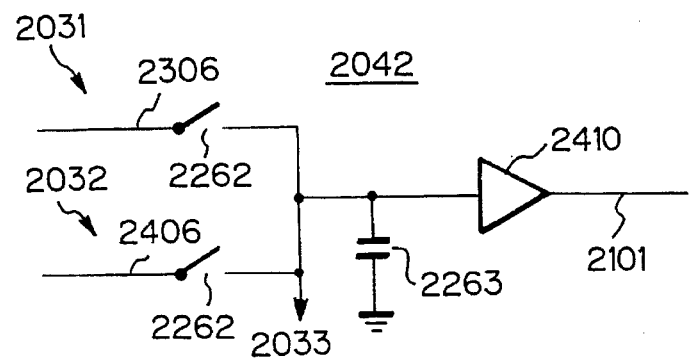
FIG. 33 is a schematic diagram showing exemplarily a circuit wherein the final output stages of the CCD signal read-out circuits provided, in FIG. 30, separately for the associated color signals, are common to each other.

FIG. 33 shows exemplarily a signal output circuit 2042 wherein the outputs 2306 and 2406 of the noise removal circuits 2016 in the sub-blocks 2031, 2032 and 2033 of the three systems shown in FIGS. 30 and 32 are converted into the dot sequential image signal. The signal output circuit 2042 is applicable to the embodiments shown in FIGS. 30 and 32. According to the signal output circuit 2042, a single capacitor 2263 is connected to the output port of the sample switches 2262. The single capacitor 2263 is also connected through an amplifier 2410 to the circuit output 2101. The sample switches 2262 are operative in response to the associated sample and hold pulses specific for the color components, so that the single capacitor 2263 holds the output derived from the sample switches 2262, thereby outputting the dot sequential output signal 2101. The circuit 2042 thus implements simultaneously the functions of sampling and holding signals as well as sequentializing the color component signals.

As described above, according to the present invention, since the CCD signal read-out circuit is not adapted to include the conventional correlated double sampling circuit including a sample and hold circuit, it is simplified in circuit structure and can be operative at a higher processing rate than the conventional read-out circuit.

Further, according to the present invention, the feed-through level and the signal level are extracted during a pixel period of the signals read out from a charge-coupled device, one of the levels is inverted and added to the other, the correlated noise due to the reset of the CCD and the fluctuating noise (1/f noise) of low frequency due to the CCD output amplifier are cancelled through the averaging operation, and the high-frequency noise is removed. Consequently, even if it is so arranged that the signal is held by the sample and hold at the succeeding stage, the aliasing of the high-frequency noise due to the sampling frequency is less than that caused by the conventional correlated double sampling circuit. It is thus possible to obtain a pixel signal which is improved in S/N ratio.

While the present invention has been described with reference to the particular illustrative embodiments, it is not to be restricted by those embodiments. It is to be appreciated that these skilled in the art can change or modify the embodiments without departing from the scope and spirit of the present invention.

What is claimed is:

1. A charge coupled device (CCD) signal read-out circuit for receiving a first signal output from a CCD and for substantially removing a reset noise from the first signal by correlated double sampling to produce a second signal that is substantially free from the reset noise, the first signal including a plurality of pixel periods each pixel period comprising a reset period, a feed-through period, and a pixel signal period, said CCD signal read-out circuit comprising:

first and second signal extractor circuits for receiving the first signal and extracting a feed-through signal and a pixel signal from each respective pixel period;

first and second low-pass filter circuits for low-pass filtering the feed-through signal and the pixel signal extracted by said first and second signal extractor circuits, respectively;

a signal hold circuit for sampling and holding the feed-through signal filtered by said first low-pass filter circuit; and a differential amplifier for subtracting the pixel signal filtered by said second low-pass filter circuit from a signal sampled and held by said signal hold circuit and outputting a resultant signal as the second signal.

2. A CCD signal read-out circuit according to claim 1, wherein said CCD is a color image sensor for producing a plurality of color signals, and wherein said CCD signal read-out circuit is provided for each of color signal.

3. A charge-coupled device (CCD) signal read-out circuit for receiving a first signal outputted from a CCD, and substantially removing a reset noise from the first signal by correlated double sampling to produce a second signal that is substantially free from reset noise, the first signal including a plurality of pixel period each pixel period comprising a reset period, a feed-through period, and a pixel signal period, said CCD signal read-out circuit comprising:

first and second signal extractor circuits for receiving the first signal and extracting a feed-through signal and an associated pixel signal from each respective pixel period;

first and second low-pass filter circuits for low-pass filtering the feed-through signal and the pixel signal extracted by said first and second signal extractor circuits, respectively;

a delay circuit for delaying the feed-through signal filtered by said first low-pass filter circuit until the associated pixel signal period comes; and a differential amplifier for subtracting the pixel signal filtered by said second low-pass filter circuit from a signal delayed by said delay circuit and outputting a resultant signal as the second signal.

4. A CCD signal read-out circuit according to claim 3, wherein said CCD is a color image sensor for producing a plurality of color signals, and wherein said CCD signal read-out circuit is provided for each of color signal.

5. A charge-coupled device (CCD) signal read-out circuit for receiving a first signal outputted from a CCD, and substantially removing a reset noise from the first signal by correlated double sampling to produce a second signal that is substantially free from the reset noise, the first signal including a plurality of pixel periods, each comprising a reset period, a feed-through period, and a pixel signal period, said CCD signal read-out circuit comprising:

a delay circuit for delaying the first signal until a pixel signal period comes and producing a delayed signal;

a first signal extractor circuit for receiving the delayed signal and extracting a feed-through signal from each pixel period;

a second signal extractor circuit for receiving the first signal and extracting the pixel signal from each pixel period;

first and second low-pass filter circuits for low-pass filtering the feed-through signal and the pixel signal extracted by said first and second signal extractor circuits, respectively; and a differential amplifier for subtracting the pixel signal filtered by said second low-pass filter circuit from the feed-through signal filtered by said first low-pass filter circuit and outputting a resultant signal as the second signal.

6. A CCD signal read-out circuit according to claim 5, wherein said CCD is a color image sensor for producing a plurality of color signals, and wherein said CCD signal read-out circuit is provided for each of color signal.

7. A charge-coupled device (CCD) signal read-out circuit for receiving a first signal outputted from a CCD, and substantially removing a reset noise from the first signal by correlated double sampling to produce a second signal that is substantially free from the reset noise, the first signal including a plurality of pixel periods, each pixel period comprising a reset period, a feed-through period, and a pixel signal period, said CCD signal read-out circuit comprising:

first and second signal extractor circuits for receiving the first signal and extracting a feed-through signal and a pixel signal from each respective pixel period;

first and second averaging means for averaging the feed-through signal and the pixel signal extracted by said first and second signal extractor circuits and for phase shifting at least one of: said averaged feed-through signal and said averaged pixel signal to bring both of the signals in phase; and a differential amplifier for producing a difference between signals outputted from said first and second averaging means and outputting a resultant signal as the second signal.

8. A CCD signal read-out circuit according to claim 7, wherein said first and second averaging means each comprise:

first and second low-pass filter circuits for low-pass filtering the feed-through signal and the pixel signal extracted by said first and second signal extractor circuits, respectively; and first and second peak detector circuits for detecting substantial peaks of the feed-through signal and the pixel signal filtered by said first low-pass filter circuit and said second low-pass filter, respectively to produce said averaged feed-through signal and said averaged pixel signal.

9. A CCD signal read-out circuit according to claim 7, wherein said first and second averaging means each comprise:

first and second integrator circuits for integrating the feed-through signal and the pixel signal extracted by said first and second signal extractor circuits, respectively to produce said averaged feed-through signal and said averaged pixel signal.

10. A CCD signal read-out circuit according to claim 7, wherein said CCD is a color image sensor for producing a plurality of color signals, and wherein said CCD signal read-out circuit is provided for each of color signal.

11. A charge-coupled device (CCD) signal read-out circuit for receiving a first signal outputted from a CCD including a plurality of pixel periods, each pixel period comprising a feed-through period and a signal period, and for substantially reducing a correlated noise and a high-frequency noise included in the signal period to produce a second signal that is substantially free from the correlated noise and the high-frequency noise, said CCD signal read-out circuit comprising:

first and second signal extractor circuits for receiving the first signal and for extracting levels of the feed-through period and the signal period for each respective pixel period to develop a feed-through signal and a pixel signal;

a signal inverter circuit for inverting one of the feed-through signal and the pixel signal extracted by said first and second signal extractor circuits, respectively, and for outputting a resultant signal in the form of a serial signal; and an averaging circuit for averaging the serial signal output from said signal inverter circuit to produce a signal in which the correlated noise and the high-frequency noise have substantially been reduced.

12. A CCD signal read-out circuit according to claim 11, further comprising a signal hold circuit for sampling and holding the signal output from said averaging circuit and outputting a resultant signal as the second signal.

13. A CCD signal read-out circuit according to claim 11, wherein said averaging circuit comprises an integrator circuit for integrating the serial signal over one pixel period.

14. A CCD signal read-out circuit according to claim 12, wherein said averaging circuit comprises an integrator circuit for integrating the serial signal over one pixel period.

15. A CCD signal read-out circuit according to claim 11, wherein said averaging circuit comprises a low-pass filter circuit for low-pass filtering the serial signal.

16. A charge-coupled device (CCD) signal read-out circuit for receiving a first signal outputted from a including a plurality of pixel periods, each pixel period comprising a feed-through period and a signal period, and for substantially reducing a correlated noise and a high-frequency noise included in the signal period to produce a second signal that is substantially free from the correlated noise and the high-frequency noise, said CCD signal read-out circuit comprising:

first and second signal extractor circuits for receiving the first signal and for extracting levels of the feed-through period and the signal period for each respective pixel period to develop a feed-through signal and a pixel signal;

a signal inverter circuit for inverting one of the feed-through signal and the pixel signal extracted by said first and second signal extractor circuits, respectively, and for outputting a resultant signal in the form of a serial signal;

a selector circuit for selecting from said serial signal a part of said serial signal for a first pixel period for developing a first serial signal, and selecting from said serial signal a part of said serial signal for a second pixel period for developing a second serial signal;

a first averaging circuit for averaging the first serial signal to output a signal wherein the correlated noise and the high-frequency noise have substantially been reduced; and a second averaging circuit for averaging the second serial signal to output a signal wherein the correlated noise and the high-frequency noise have substantially been reduced.

17. A CCD signal read-out circuit according to claim 16, further comprising:

a first sampling circuit for sampling the signal output from said first averaging circuit in time with the first pixel period;

a second sampling circuit for sampling the signal output from said second averaging circuit in time with the second pixel period; and a signal holding circuit for holding the signals sampled by said first and second sampling circuits and outputting the sampled signals in serial form as the second signal.

18. A CCD signal read-out circuit according to claim 16, wherein the first signal is a color image signal including a plurality of color components, the first pixel period being a pixel period for a first color component, the second pixel period being a pixel period for a second color component.

19. A charge-coupled device (CCD) signal read-out circuit for receiving a first signal outputted from a CCD including a plurality of pixel periods, each pixel period comprising a feed-through period and a signal period, and for substantially reducing a correlated noise and a high-frequency noise included in the signal period to produce a second signal that is substantially free from the correlated noise and the high-frequency noise, said CCD signal read-out circuit comprising:

a first signal extractor circuit for receiving the first signal and extracting levels of the feed-through period and the signal period during a first pixel period to develop a first feed-through signal and a first pixel signal;

a second signal extractor circuit for receiving the first signal and extracting levels of the feed-through period and the signal period during a second pixel period to develop a second feed-through signal and a second pixel signal;

a first signal inverter circuit for inverting one of the first feed-through signal and the first pixel signal and outputting a resultant signal as a first serial signal;

a second signal inverter circuit for inverting one of the second feed-through signal and the second pixel signal and outputting a resultant signal as a second serial signal;

a first averaging circuit for averaging the first serial signal output from said first signal inverter circuit to output a signal wherein the correlated noise and the high-frequency noise have substantially been reduced.

20. A CCD signal read-out circuit according to claim 19, further comprising:

a first sampling circuit for sampling the signal output from said first averaging circuit in time with the first pixel period;

a second sampling circuit for sampling the signal output from said second averaging circuit in time with the second pixel period; and a signal holding circuit for holding the signals sampled by said first and second sampling circuits and outputting, sampled signals in serial as the second signal.

21. A CCD signal read-out circuit according to claim 19, wherein the first signal is a color image signal including a plurality of color components, the first pixel period being a pixel period for a first color component, the second pixel period being a pixel period for a second color component.

\* \* \* \* \*